US010373855B2

(12) United States Patent
Pilch

(10) Patent No.: US 10,373,855 B2
(45) Date of Patent: Aug. 6, 2019

(54) METHOD FOR PROCESSING A WAFER AND METHOD FOR PROCESSING A CARRIER

(71) Applicant: Infineon Technologies AG, Neubiberg (DE)

(72) Inventor: Karl Pilch, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/690,316

(22) Filed: Aug. 30, 2017

(65) Prior Publication Data

US 2018/0061695 A1 Mar. 1, 2018

(30) Foreign Application Priority Data

Aug. 31, 2016 (DE) ........................ 10 2016 116 241

(51) Int. Cl.

| | |
|---|---|
| ***H01L 21/683*** | (2006.01) |
| ***H01L 21/268*** | (2006.01) |
| ***H01L 21/68*** | (2006.01) |
| ***H01L 23/544*** | (2006.01) |
| ***H01L 21/78*** | (2006.01) |
| ***H01L 21/302*** | (2006.01) |

(52) U.S. Cl.

CPC ........ *H01L 21/6835* (2013.01); *H01L 21/268* (2013.01); *H01L 21/302* (2013.01); *H01L 21/681* (2013.01); *H01L 21/7806* (2013.01); *H01L 23/544* (2013.01); *H01L 2221/68381* (2013.01); *H01L 2223/54426* (2013.01)

(58) Field of Classification Search

CPC .. H01L 21/6835; H01L 21/268; H01L 21/681

See application file for complete search history.

(56) References Cited

U.S. PATENT DOCUMENTS

2009/0056513 A1 3/2009 Baer
2015/0318166 A1 11/2015 Kautzsch et al.
2017/0025275 A1* 1/2017 Hirata .................... B23K 26/53

* cited by examiner

*Primary Examiner* — Errol V Fernandes

(74) *Attorney, Agent, or Firm* — Viering, Jentschura & Partner MBB

(57) ABSTRACT

According to various embodiments, a method for processing a wafer may include scanning a focused laser beam over the wafer to form a defect structure within the wafer, the defect structure defining a first region of the wafer located at a first side of the defect structure and a second region of the wafer located at a second side of the defect structure opposite the first side, and an edge region laterally surrounding the defect structure and extending from a first surface of the wafer to a second surface of the wafer opposite the first surface. A surface area of the first region is greater than a surface area of the edge region, and the second region is connected to the first region by the edge region. The method may further include, separating the first region and the second region from each other along the defect structure, with the first region remaining in one piece.

18 Claims, 14 Drawing Sheets

720

METHOD FOR PROCESSING A WAFER AND METHOD FOR PROCESSING A CARRIER

CROSS-REFERENCE TO RELATED APPLICATION

This application claims priority to German Patent Application Serial No. 10 2016 116 241.8, which was filed Aug. 31, 2016, and is incorporated herein by reference in its entirety.

TECHNICAL FIELD

Various embodiments relate generally to a method for processing a wafer and a method for processing a carrier.

BACKGROUND

In general, there may be a variety of applications in microelectronics, microsystems, biomedical, and other fields for thin chips or ultra-thin chips being formed for example on a carrier having a thickness in the range of about several tens of micrometers, e.g. on a silicon wafer with a thickness less than about 50 μm. One method for fabricating such thin or ultra-thin wafers may be wafer grinding. Wafer grinding techniques as commonly applied for thinning wafers based on a mechanical treatment of the wafer may introduce defects into the wafer, and may be difficult to control, which may lead to yield loss and therefore high cost. However, there may be attempts for manufacturing ultra-thin chips based on wafer pre-processing, wherein after the CMOS processing each single chip of a plurality of ultra-thin chips may be removed separately from the pre-processed wafer via a so-called Pick, Crack & Place™ process.

SUMMARY

According to various embodiments, a method for processing a wafer may include scanning a focused laser beam over the wafer to form a defect structure within the wafer, the defect structure defining a first region of the wafer located at a first side of the defect structure and a second region of the wafer located at a second side of the defect structure opposite the first side, and an edge region laterally surrounding the defect structure and extending from a first surface of the wafer to a second surface of the wafer opposite the first surface. A surface area of the first region is greater than a surface area of the edge region, and the second region is connected to the first region by the edge region. The method may further include, separating the first region and the second region from each other along the defect structure, with the first region remaining in one piece.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

Figure 1:
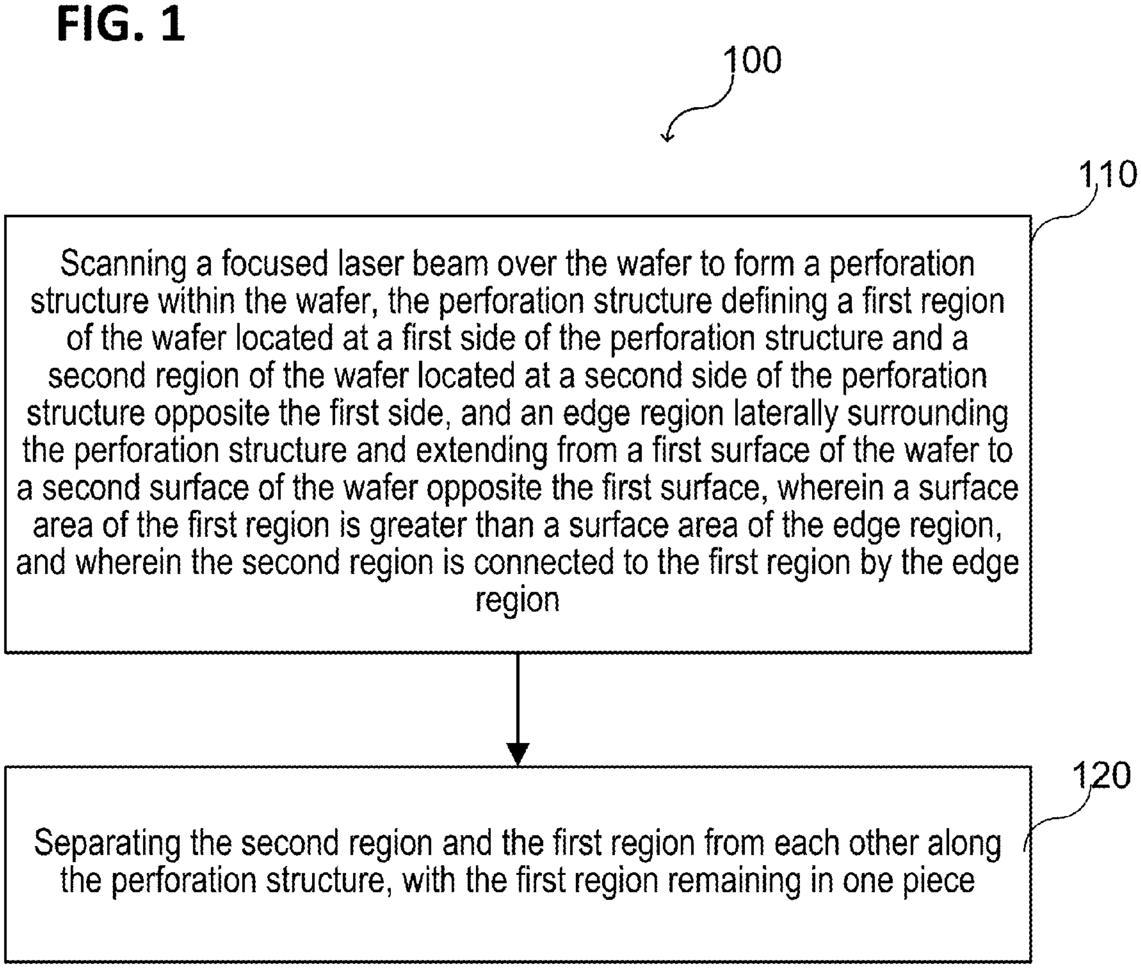
FIG. 1 shows a schematic flow diagram of a method for processing a wafer, according to various embodiments.

The following detailed description refers to the accompanying drawings that show, by way of illustration, specific details and embodiments in which the invention may be practiced.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments. Various embodiments are described in connection with methods and various embodiments are described in connection with devices. However, it may be understood that embodiments described in connection with methods may similarly apply to the devices, and vice versa.

The terms "at least one" and "one or more" may be understood to include any integer number greater than or equal to one, i.e. one, two, three, four, [ . . . ], etc. The term "a plurality" or the phrase "one or more" may be understood to include any integer number greater than or equal to two, i.e. two, three, four, five, [ . . . ], etc.

The word "over", used herein to describe forming a feature, e.g. a layer "over" a side or surface, may be used to mean that the feature, e.g. the layer, may be formed "directly on", e.g. in direct contact with, the implied side or surface. The word "over", used herein to describe forming a feature, e.g. a layer "over" a side or surface, may be used to mean that the feature, e.g. the layer, may be formed "indirectly on" the implied side or surface with one or more additional layers being arranged between the implied side or surface and the formed layer.

In like manner, the word "cover", used herein to describe a feature disposed over another, e.g. a layer "covering" a side or surface, may be used to mean that the feature, e.g. the layer, may be disposed over, and in direct contact with, the implied side or surface. The word "cover", used herein to describe a feature disposed over another, e.g. a layer "covering" a side or surface, may be used to mean that the feature, e.g. the layer, may be disposed over, and in indirect contact with, the implied side or surface with one or more additional layers being arranged between the implied side or surface and the covering layer.

The term “lateral” used with regards to the “lateral” extension of a structure (or of a structure element) provided on or in a carrier (e.g. a layer, a substrate, a wafer, or a semiconductor work piece), “laterally” next to, or a “lateral” direction, may be used herein to mean an extension or a positional relationship along a surface of the carrier. That means that a surface of a carrier (e.g. a surface of a substrate, a surface of a wafer, or a surface of a work piece) may serve as reference, commonly referred to as the main processing surface. Further, the term “width” used with regards to a “width” of a structure (or of a structure element) may be used herein to mean the lateral extension of a structure. Further, the term “height” used with regards to a height of a structure (or of a structure element), may be used herein to mean an extension of a structure along a direction perpendicular to the surface of a carrier (e.g. perpendicular to the main processing surface of a carrier). The term “thickness” used with regards to a “thickness” of a layer may be used herein to mean the spatial extension of the layer perpendicular to the surface of the support (the material or material structure) on which the layer is deposited. If a surface of the support is parallel to the surface of the carrier (e.g. parallel to the main processing surface) the “thickness” of the layer deposited on the surface of the support may be the same as the height of the layer. The thickness of a wafer or wafer region may be understood as the spatial extension of the wafer perpendicular to a main processing surface of the wafer. In general, a wafer may have a front side surface, e.g. a main processing surface, and a backside surface opposite the front side surface. These two surfaces of a wafer are referred to herein as first surface and second surface, without loss of generality.

According to various embodiments, a semiconductor wafer (or any other suitable semiconductor carrier) may be made of or may include silicon. However, other semiconductor materials of various types may be used in a similar way, e.g. germanium, Group III to V (e.g. SiC), or other types, including for example polymers. In an embodiment, the semiconductor layer is a wafer made of silicon (e.g. p-type doped or n-type doped). In an alternative embodiment, the semiconductor layer is a silicon on insulator (SOI) wafer.

FIG. 1 shows a schematic flow diagram of a method 100 for processing a wafer (e.g. a carrier in wafer size and/or wafer shape), according to various embodiments, wherein the method 100 may include: in 110, scanning a focused laser beam over the wafer to form a defect structure (also referred to as perforation structure) within the wafer, the defect structure defining a first region of the wafer located at a first side of the defect structure and a second region of the wafer located at a second side of the defect structure opposite the first side, and an edge region laterally surrounding the defect structure and extending from a first surface of the wafer to a second surface of the wafer opposite the first surface, wherein a surface area of the first region is greater than a surface area of the edge region, and wherein the second region is connected to the first region by the edge region, and, subsequently, in 120, separating the first region and the second region from each other along the defect structure, with the first region remaining in one piece.

Illustratively, the edge region may be small compared to the first region to allow the first region being used as a thinned wafer after the first region and the second region are separated from each other. As an example, the wafer may have a circular shape and the edge region may be an outer rim of the wafer.

Figure 2A:
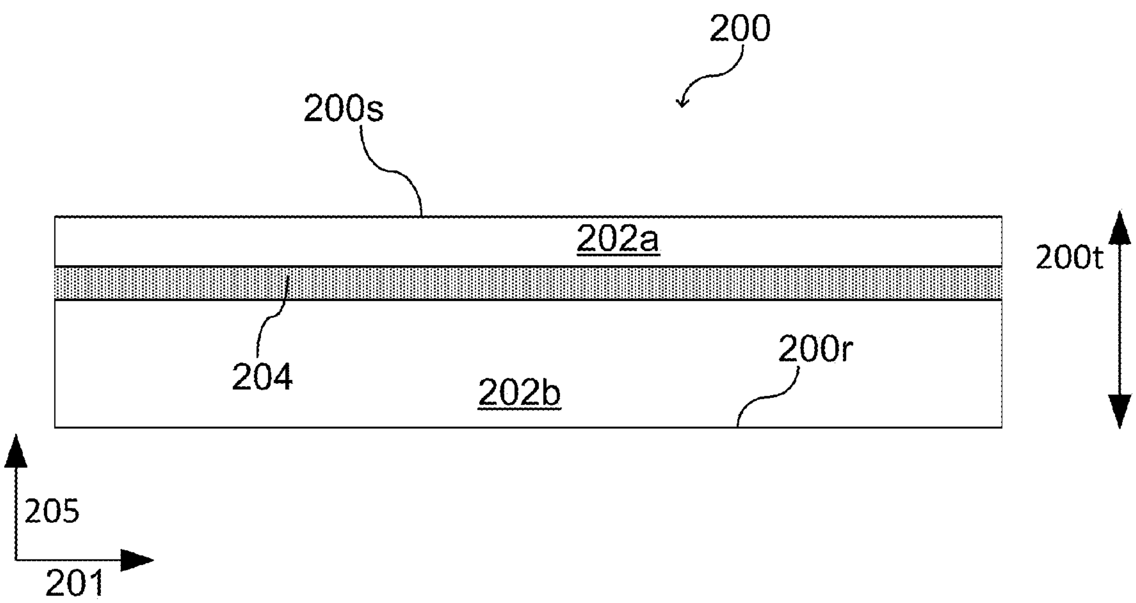
FIGS. 2A to 2C respectively show a wafer in a schematic view at various processing stages, according to various embodiments.
Figure 2B:
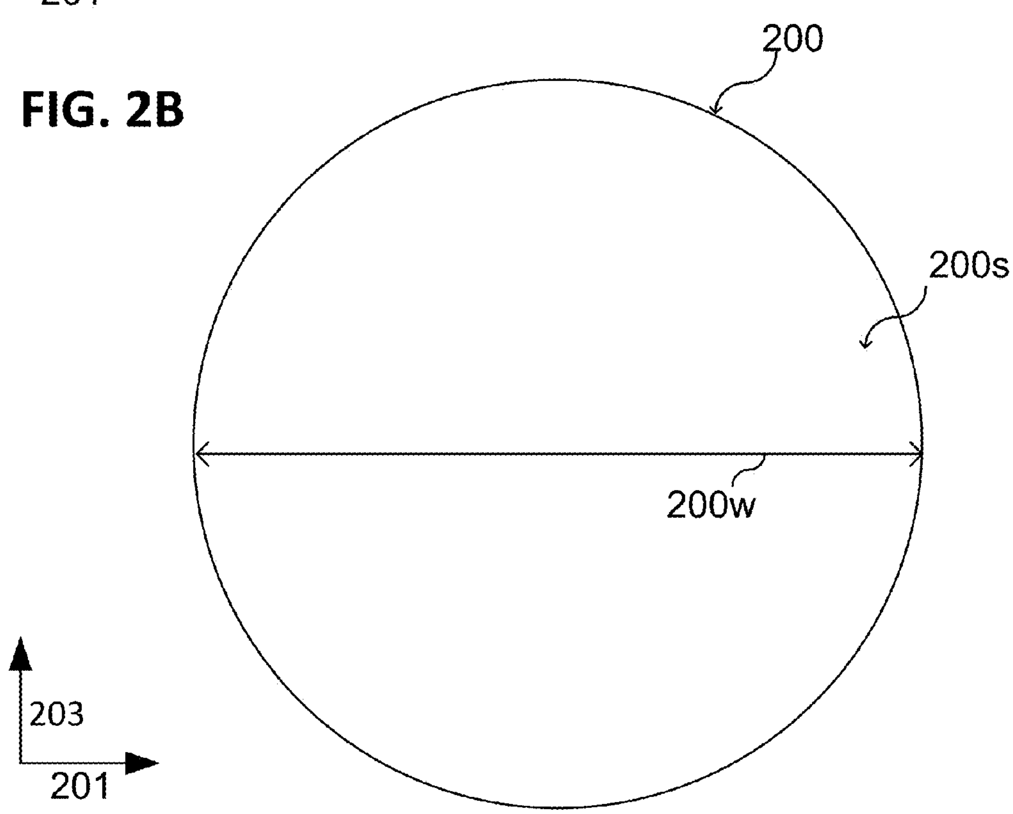
Figure 2C:
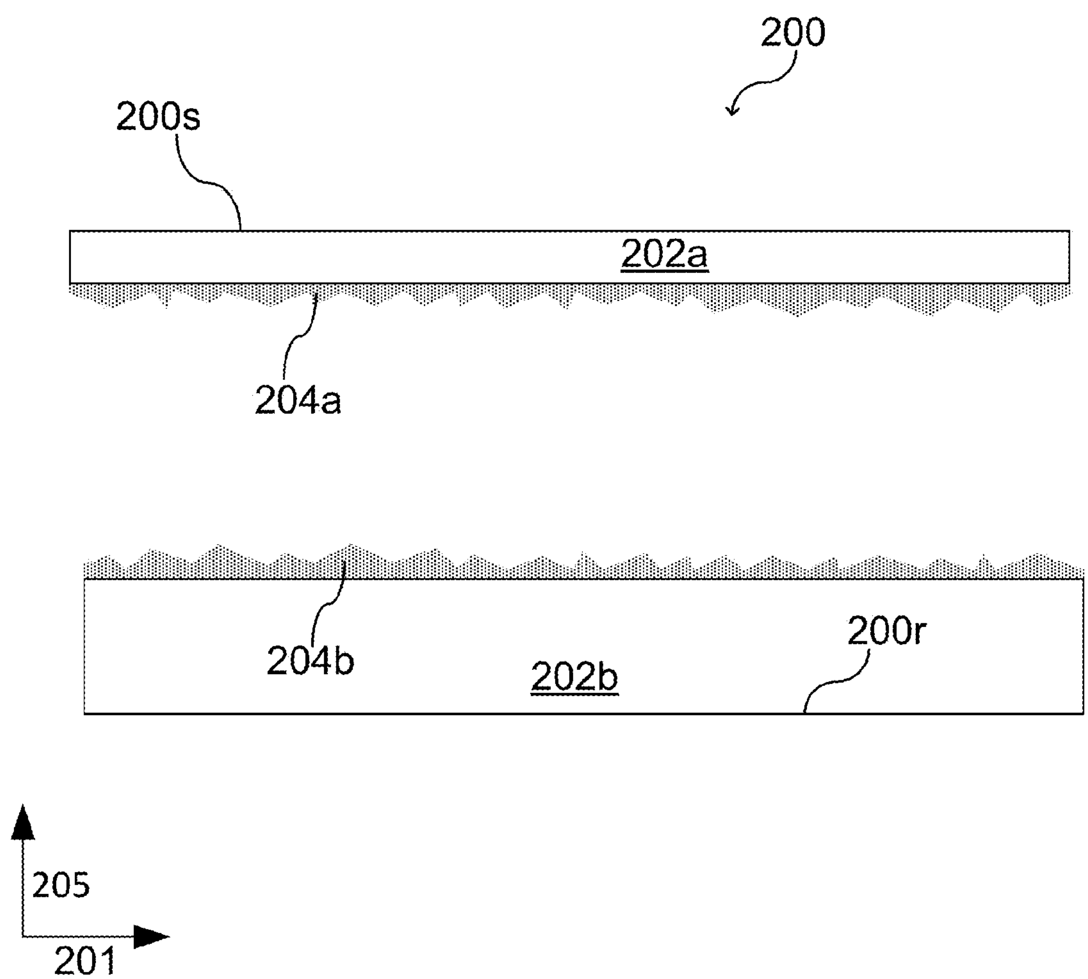

FIGS. 2A and 2B respectively illustrate a wafer 200 during processing, e.g. during process 110 of method 100 is carried out or after process 110 of method 100 has been carried out, and the FIG. 2C illustrates the wafer 200 during processing, e.g. during process 120 of method 100 is carried out or after process 120 of method 100 has been carried out. The wafer 200 may be processed in a similar way via method 500 illustrated in FIG. 5 or method 600 illustrated in FIG. 6.

FIG. 2A illustrates, in a schematic view, a cross section of a wafer 200 after a defect structure 204 has been formed within the wafer 200, according to various embodiments. FIG. 2B illustrates a schematic top view of the wafer 200. The wafer 200 may have a first surface 200*s*. The first surface 200*s* may be a so called processing surface, main processing surface, or front side of the wafer 200. Further, the wafer 200 may have a second surface 200*r* opposite the first surface 200*s*. The second surface 200*s* may be a so called backside surface of the wafer 200. The wafer 200 may have a lateral extension 200*w*, also referred to as width or diameter of the wafer 200, along direction 201 and a vertical extension 200*t*, also referred to as thickness of the wafer 200, along direction 205 perpendicular to direction 201. According to various embodiments, the lateral extension 200*w* of the wafer 200 may be greater than about 50 mm, e.g. in the range from about 50 mm to about 450 mm, or even greater than 450 mm. According to various embodiments, the vertical extension 200*t* of the wafer 200 may be greater than about 100 μm, e.g. in the range from about 0.1 mm to about 2 mm, e.g. in the range from about 0.5 mm to about 1 mm.

According to various embodiments, the wafer 200 may have substantially a circular shape, as for example illustrated in FIG. 2B. Wafers 200 with a circular shape may be used for example in semiconductor processing. However, the wafer 200 may have any other suitable plate-shape, e.g. a polygonal shape, e.g. a rectangular or square shape. If the wafer 200 may have a polygonal shape, the wafer 200 may have rounded or beveled corners, as for example used in photovoltaic devices (e.g. solar cells).

According to various embodiments, the wafer 200 may include a defect structure 204 (also referred to as predetermined breaking structure or defect structure 204) disposed within the wafer. The defect structure 204 may be formed via a focused laser beam, as described herein. The focused laser beam may be used to locally damage the crystal (e.g. changing the crystal structure) of the wafer material thereby forming the defect structure 204 within the wafer 200. The defect structure 204 may be understood as a predetermined breaking plane (e.g. a predetermined breaking layer) due to a local modification of the wafer 200 by the focused laser beam. The wafer 200 may include silicon or may be a silicon wafer, e.g. including or made of single crystalline silicon. According to various embodiments, the focused laser beam may be used to locally generate crystal damage in the single crystalline silicon thereby providing the defect structure 204. The defect structure 204 may include polycrystalline and/or amorphous wafer material, e.g. polycrystalline and/or amorphous silicon.

According to various embodiments, the defect structure 204 may define a first region 202*a* of the wafer 200 disposed above (or in other words over) the defect structure 204 and a second region 202*b* of the wafer 200 disposed below (or in other words under) the defect structure 204. In other words, the defect structure 204 may define a first region 202*a* of the wafer 200 located at a first side of the defect structure 204 and a second region 202*b* of the wafer 200 located at a second side of the defect structure 204 opposite the first side. Illustratively, the defect structure 204 spatially separates a first region 202*a* (e.g. a surface region) of the wafer 200 and a second region 202*b* (e.g. a bulk region) of the wafer 200 from each other. The first region 202 may include the first surface 202*a* and the second region 202*b* may include the second surface 202*b*.

According to various embodiments, the defect structure 204 may laterally extend completely through the wafer 200, as illustrated in FIGS. 2A to 2C. In other words, the lateral extension of the defect structure 204 may be the same as the lateral extension 200*w* of the wafer 200. In this case, only the defect structure 204 may connect the first region 202*a* and the second region 202*b* with each other before they are separated from each other. FIG. 2C illustrates, in a schematic view, a cross section of the first region 202*a* and the second region 202*b* being separated from each other along the defect structure 204. According to various embodiments, the first region 202*a* and the second region 202*b* may be separated from each other by breaking (or in other words cracking) the defect structure 204. Therefore, the wafer 200 may be subjected to a mechanical stress, e.g. via bending the wafer 200, to assist or cause fracture of the defect structure 204. According to various embodiments, after separating the first region 202*a* and the second region 202*b* from each other, a part 204*a* of the defect structure 204 may adhere to the first region 202 and/another part 204*b* of the defect structure 204 may adhere to the second region 202. Alternatively, after separating the first region 202*a* and the second region 202*b* from each other, the defect structure 204 may adhere only at the first region 202 or only at the second region 202.

If it is desired, according to various embodiments, the remaining parts 204*a*, 204*b* of the defect structure 204 may be removed after separating the first region 202*a* and the second region 202*b* from each other, e.g. via etching, grinding, and the like.

Figure 3A:
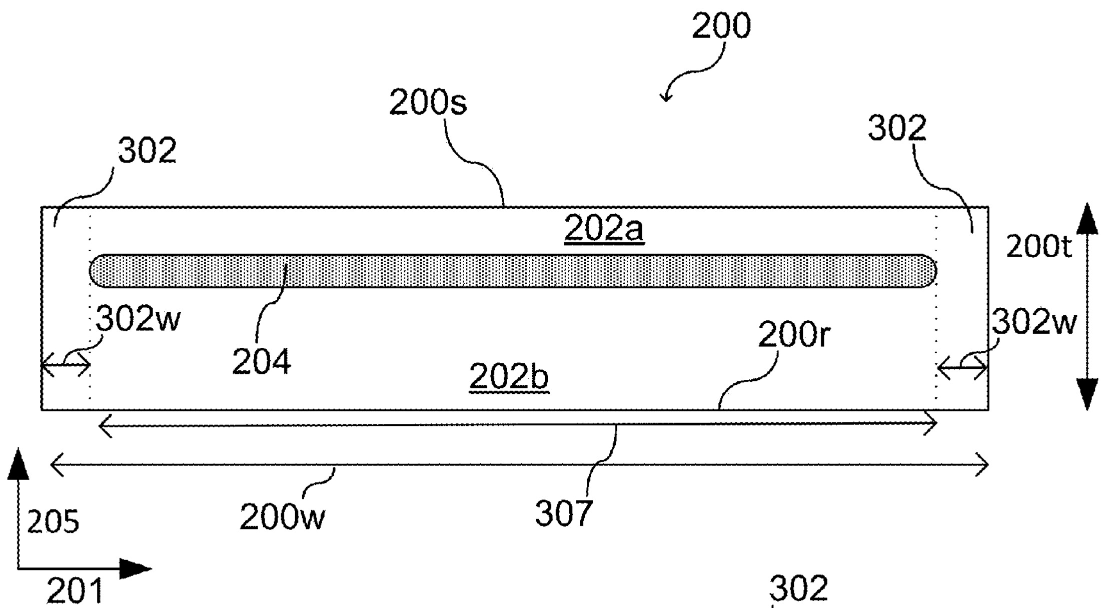
FIGS. 3A to 3C respectively show a wafer in a schematic view at various processing stages, according to various embodiments.
Figure 3B:
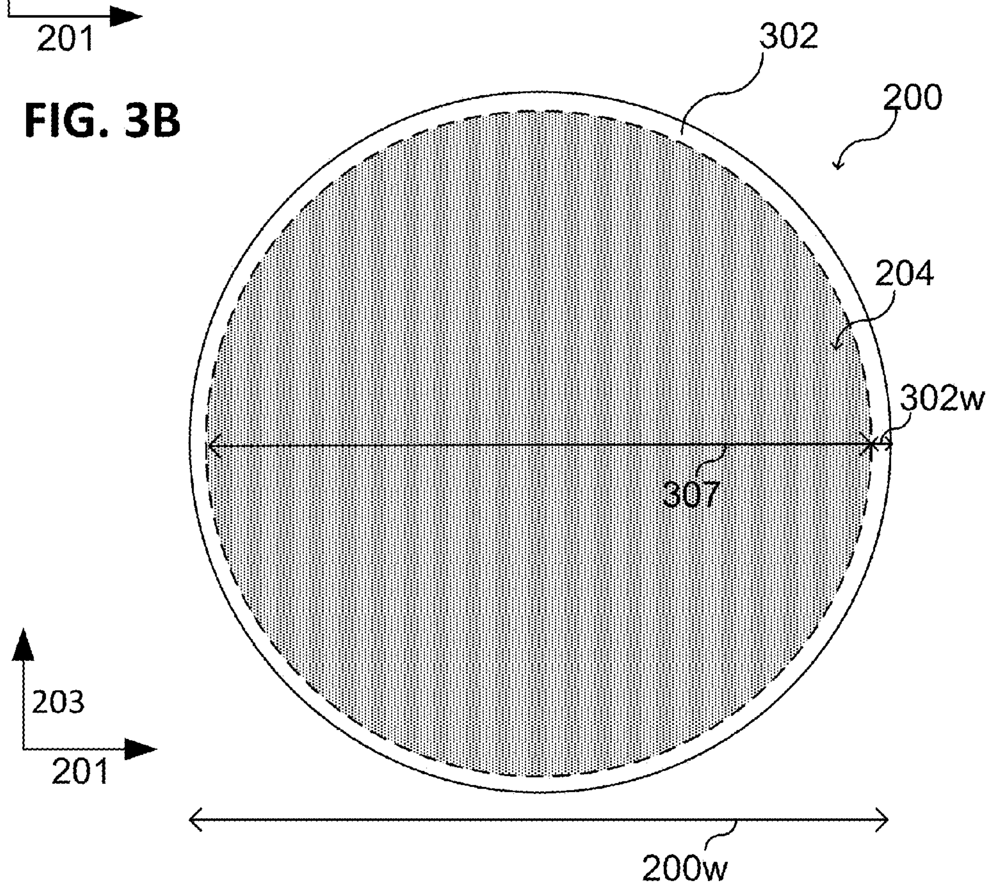

Alternatively to the embodiments described with reference to FIGS. 2A to 2C, the defect structure 204 may be formed in such a way that an edge region 302 laterally surrounds the defect structure 204, as illustrated in FIGS. 3A to 3B. In this case, the lateral extension 307 of the defect structure 204 may be smaller than the lateral extension 200*w* of the wafer 200. FIG. 3A illustrates, in a schematic view, a cross section of a wafer 200 after a defect structure 204 has been formed within the wafer 200, according to various embodiments. FIG. 3B illustrates a schematic top view of the wafer 200.

According to various embodiments, the edge region 302 may extend from the first surface 200*s* of the wafer 200 to the second surface 200*r* of the wafer 200 opposite the first surface 200*s*, as illustrated in FIG. 3A. The lateral extension 302*w* of the edge region 302 may be defined by the lateral extension 307 of the defect structure 204 and the lateral extension 200*w* of the wafer 200. In the case that the wafer 200 has a circular shape, as exemplarily illustrated in FIG. 3B, the width 302*w* of the edge region 302 may be half of the difference between the diameter 200*w* of the wafer 200 and the diameter 307 of the defect structure 204.

According to various embodiments, the defect structure 204 may have a lateral extension 307 greater than about 100 μm, e.g. greater than about 1 mm, e.g. greater than about 1 cm, e.g. greater than about 10 cm. However, the lateral extension 307 of the defect structure 204 may be limited by the lateral extension of the wafer 200 (e.g. considering the width 302*w* of edge region 302). According to various embodiments, the width 302*w* of the edge region 302 may be small compared to the lateral extension 200*w* of wafer 200, e.g. the width 302*w* of the edge region 302 may be less than about 10% of the lateral extension 200*w* of wafer 200.

According to various embodiments, the surface area of the first region 202*a* may be greater than a surface area of the edge region 302*e*. The surface area of the first region 202*a* may be defined by the lateral extension 307 and the shape of the defect structure 204. Accordingly, the surface area of the edge region 302*e* may be defined by the lateral extension 307 and the shape of the defect structure 204 and the lateral extension 200*w* and the shape of the wafer 200. Illustratively, the surface area of the first region may be the same as the area of the defect structure 204 with reference to (e.g. projected on) the geometric plane spanned by the directions 201, 203, e.g. with reference to the geometric plane defined by first surface 202*a* of the wafer. In other words, different areas, as referred to herein, may be compared with each other with reference to the geometric plane defined by the surface 200*s* of the wafer 200.

According to various embodiments, the lateral extension 200*w* of the wafer 200 may be in the range from about 150 mm to about 450 mm, wherein the method 100 may not be limited by the lateral extension 200*w* of the wafer 200. Accordingly, the lateral extension 307 of the defect structure 204 may be less than lateral extension 200*w* of the wafer 200, e.g. in the range from 149 mm to about 449 mm. According to various embodiments, the surface area of the edge region 302 may be in the range from about 0.01% to about 20% of the surface area of the wafer 200, e.g. in the range from about 0.1% to about 10%.

According to various embodiments, the surface area of the first region 202*a* may be greater than the surface area of the edge region 302, e.g. the surface area ratio (first region area/edge region area) may be greater than 3, or e.g. greater than 4, or e.g. greater than 5, or e.g. greater than 6, or e.g. greater than 7, or e.g. greater than 8, or e.g. greater than 9, or e.g. greater than 10, or e.g. greater than 20, or e.g. greater than 50, or e.g. greater than 100, or e.g. greater than 200, or e.g. greater than 500. In other words, the surface area of the first region 202*a* may be as large as possible and the surface area of the edge region 302 may be as small as possible (e.g. limited by the desired width 302*w* of the edge region 302). As described before, the surface area of the first region 202*a* and the surface area of the edge region 302 may be for example measured with respect to the geometric plane spanned by the directions 201, 203.

According to various embodiments, the second region 204*b* may be connected to the first region 204*a* by the edge region 302 and by the defect structure 204. Therefore, separating the first region 202*a* and the second region 202*b* from each other may include breaking the defect structure 204, as described before with reference to FIG. 2C, and separating the connection provided by the edge region 302. According to various embodiments, separating the first region 202*a* and the second region 202*b* from each other may include breaking the defect structure 204 and breaking the edge region 302 of the wafer 200, e.g. via a mechanical stress subjected to the wafer 200 (cf. FIG. 3C). Alternately, a separation structure may be formed to assist separating the first region 202*a* and the second region 202*b* from each other (cf. FIGS. 4A and 4B).

Figure 3C:
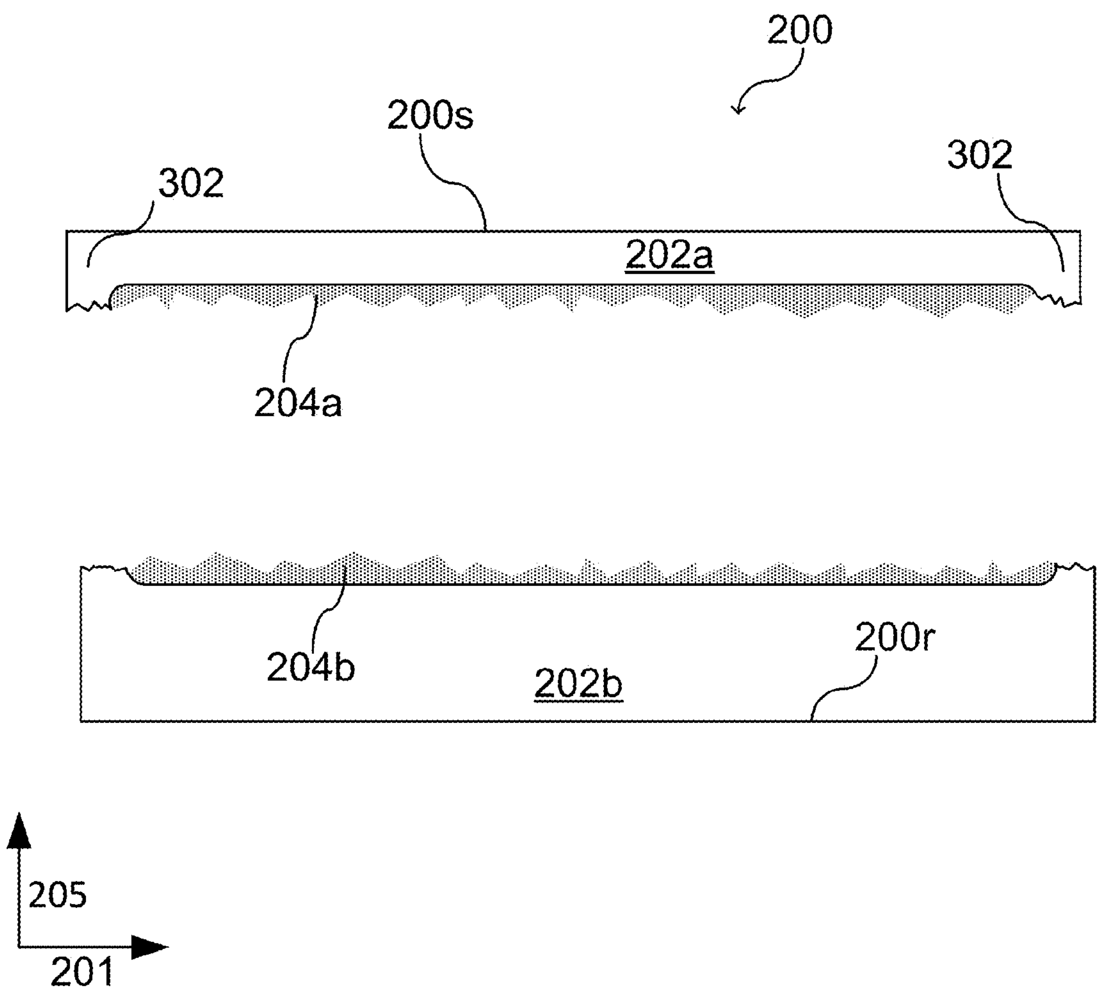

FIG. 3C illustrates, in a schematic view, a cross section of the first region 202*a* and the second region 202*b* being separated from each other along the defect structure 204 via breaking the defect structure 204 and breaking the edge region 302 (cf. FIG. 2C).

Figure 4A:
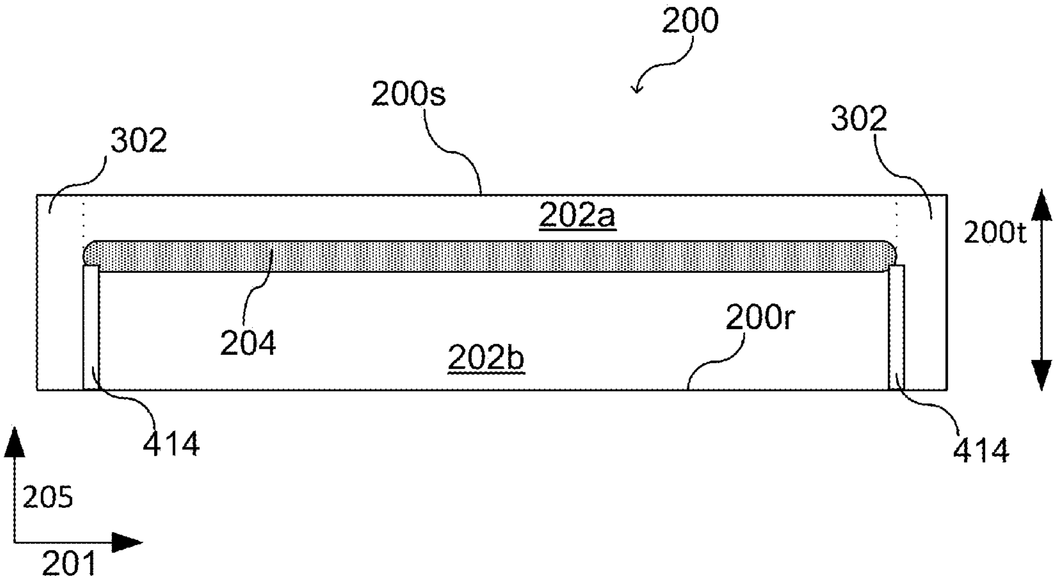
FIGS. 4A and 4B respectively show a wafer in a schematic view at various processing stages, according to various embodiments.

FIG. 4A illustrates, in a schematic view, a cross section of a wafer 200 after a defect structure 204 has been formed within the wafer 200 and after a separation structure 414 has been formed within the wafer 200, according to various embodiments.

According to various embodiments, the separation structure 414 may extend from the second surface 200*r* of the wafer 200 into the wafer 200 to the defect structure 204. According to various embodiments, the separation structure 414 may partially or completely laterally surround the second region 202*b* of the wafer 200. According to various embodiments, the separation structure 414 may include a trench structure, a further defect structure, and/or any other structure that assists separating the first region 202*a* and the second region 202*b* from each other. According to various embodiments, the separation structure 414 may be a further defect structure formed via a focused laser beam, as described herein.

If the separation structure laterally surrounds the second region 202*b* only partially, a connection structure may remain connecting the second region 202*b* to the edge region 302. Accordingly, separating the second region 202*b* and the first region from each other may also include breaking (e.g. cracking) the connection structure.

According to various embodiments, the separation structure 414 may alternatively extend from the first surface 200*s* of the wafer 200 into the wafer 200 to the defect structure 204. In this case, the separation structure 414 may partially or completely laterally surround the first region 202*a* of the wafer 200.

Figure 4B:
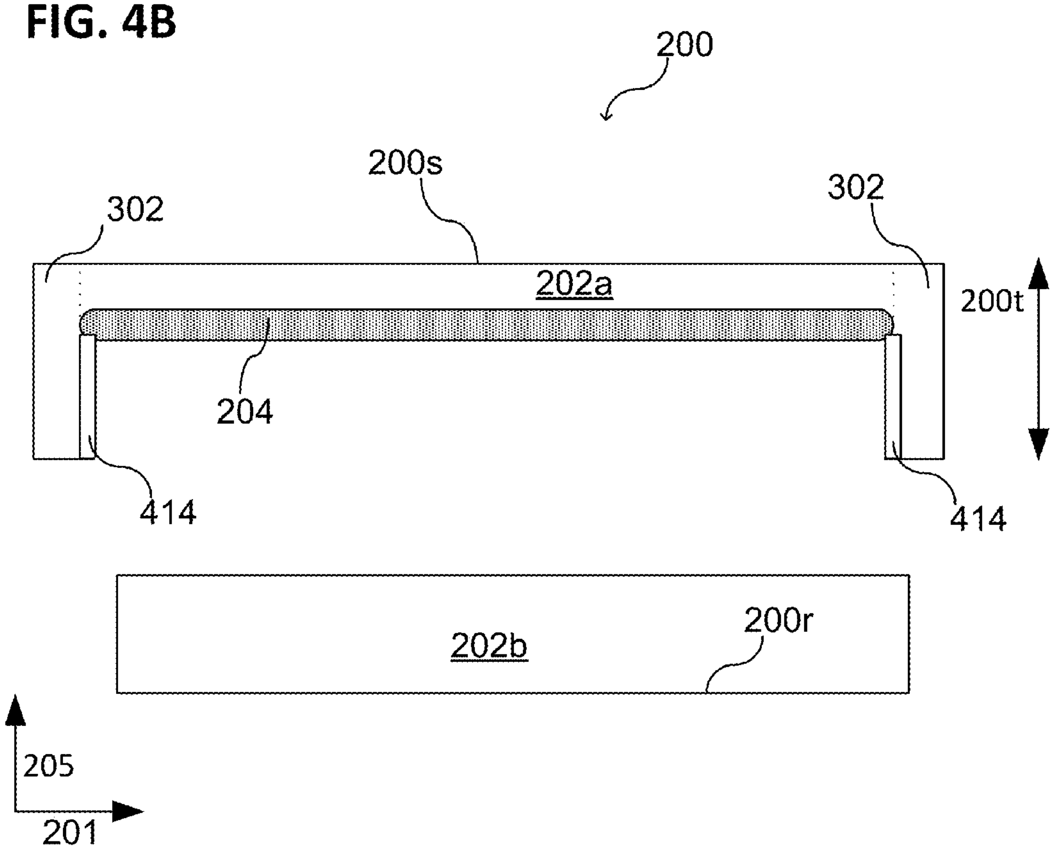

FIG. 4B illustrates, in a schematic view, a cross section of the first region 202*a* and the second region 202*b* being separated from each other along the defect structure 204 and along the separation structure 414. According to various embodiments, the edge region 302 may remain connected with the first region 200*s* after separating the first region 202*a* and the second region 202*b* from each other. Illustratively, the size and shape of the removed second region 202*b* may be defined by the respective position of the defect structure 204 and the separation structure 414. Alternatively, only a part of the edge region 302 may remain connected with the first region 200*s* after separating the first region 202*a* and the second region 202*b* from each other.

As described before, the method 100 may be used to generate a first region 202*a* that has a thickness less than the thickness 200*t* of the wafer 200. Therefore, the method 100 may allow thinning a wafer 200 to a desired thickness defined by the vertical extension of the first region 202*a*. Illustratively, the first region 202*a* may be used as a thinned wafer as conventionally processed in semiconductor industry. The position and size of the defect structure 204 may by selected to provide the first region 202*a* with a desired thickness, e.g. less than about 50 μm. If the first region 202*a* may be too thin for wafer handling, the edge region 302 may be used to mechanically support the shape of the first region 202*a*. Illustratively, the edge region 302 may be a ring support structure surrounding and stabilizing the first region 202 in a similar way as a so called TAIKO wafer.

Further, a dicing tape may be used to support the first region 202*a* or to separate the first region 202*a* from the second region 202*b*. The dicing tape may be laminated onto the first surface 200*s* of the wafer 200. After separating the first region 202*a* and the second region 202*b* from each other, the first region may adhere at the dicing tape.

After the defect structure 204 has been form in the wafer 200, any suitable process may be used to remove the second region 202*b* from the first region 202*a*. The second region 202*b* may be removed from the first region 202*a* in one piece.

The surface area of the first region 202*a* (which may be a new processing area provided by the first region 202*a* as thin or ultra-thin carrier or wafer) may be substantially as large as the surface area of the initial wafer 200 from which the first region 202*a* has been formed, e.g. the surface area of the first region 202*a* may be greater than at least 80% of the surface area of the wafer 200, or e.g. the surface area of the first region 202*a* may be greater than at least 90% of the surface area of the wafer 200, or e.g. the surface area of the first region 202*a* may be greater than at least 95% of the surface area of the wafer 200, or e.g. the surface area of the first region 202*a* may be greater than at least 99% of the surface area of the wafer 200. This may allow to provide an efficient process for wafer thinning or, in other words, for forming a thin or ultra-thin carrier 202*a*. Illustratively, removing the second region 202*b* from the first region 202*a* may be understood as thinning wafer 200. The thinned wafer 202*a* is provided by the first region 202*a* that may remain in a single piece during manufacturing, i.e. until dicing the first region 202*a* into a plurality of chips.

According to various embodiments, the first region 202*a* and the second region 202*b* may be separated from each other by using any suitable tool or processing, e.g. a stamp or a plate being covered with an wafer tape or an adhesive tape, according to various embodiments. Also commonly used dicing processes, e.g. laser cutting, sawing, etching, and the like, may be used after the defect structure 204 is formed to separate the first region 202*a* and second region 202*b* from each other.

According to various embodiments, the first region 202*a* may include a plurality of chip regions. Further, the plurality of chip regions may be singulated into a plurality of chips after the first region 202*a* and the second region 202*b* have been separated from each other.

Figure 5:
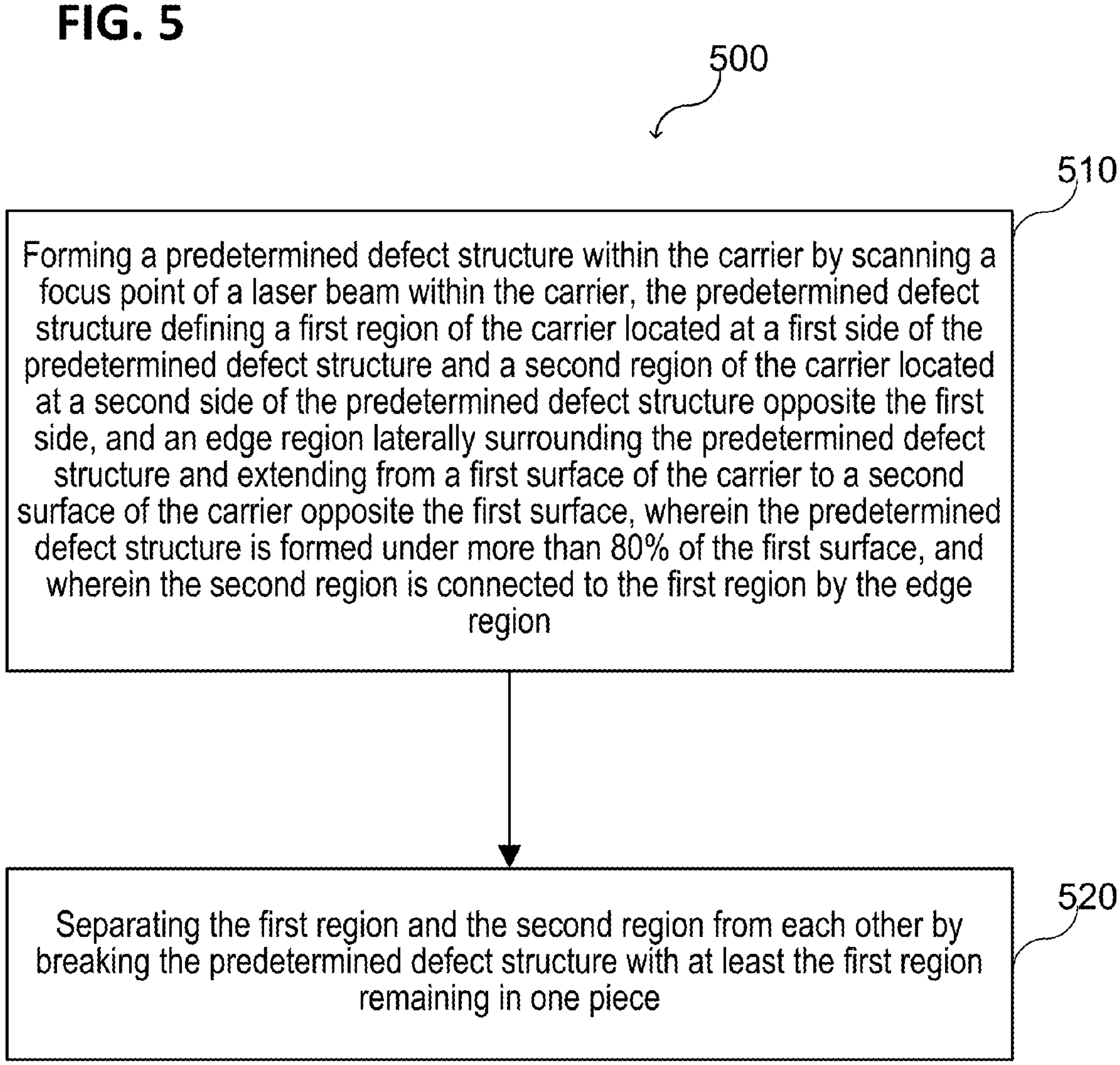
FIG. 5 shows a schematic flow diagram of a method for processing a wafer, according to various embodiments.

FIG. 5 shows a schematic flow diagram of a method 500 for processing a carrier 200 (e.g. a carrier in wafer size and/or wafer shape), according to various embodiments, wherein the method 500 may include: in 510, forming a defect structure 204 (also referred to as perforation structure or predefined breaking structure) within the carrier 200 by scanning a focus region of a laser beam within the carrier 200, the defect structure 204 defining a first region 202*a* of the carrier 200 located at a first side of the defect structure 204 and a second region 202*b* of the carrier 200 located at a second side of the defect structure 204 opposite the first side, and an edge region 302 laterally surrounding the defect structure 204 and extending from a first surface 200*s* of the carrier 200 to a second surface 200*r* of the carrier 200 opposite the first surface 200*s*, wherein the defect structure 204 is formed under more than 80% of the first surface 200*s*, and wherein the second region 202*b* is connected to the first region 202*a* by the edge region 302, and, subsequently, in 520, separating the first region 202*a* and the second region 202*b* from each other by breaking the defect structure 204 with at least the first region remaining in one piece. Further, also the second region 202*b* may remain in one piece during separating the second region 202*b* and the first region 202*a* from each other. The edge region 302 may also laterally surround the first region 202*a* and second region 202*b*.

According to various embodiments, the focus region of the laser beam may be scanned within the carrier 200 along a two-dimensional breaking plane (cf. FIGS. 2A to 4B) or along a three dimensional breaking pattern (cf. FIG. 8). The edge region 302 may mechanically support the first region

202a after the second region 202b has been removed from the first region 202a and the edge region 302.

Figure 6:
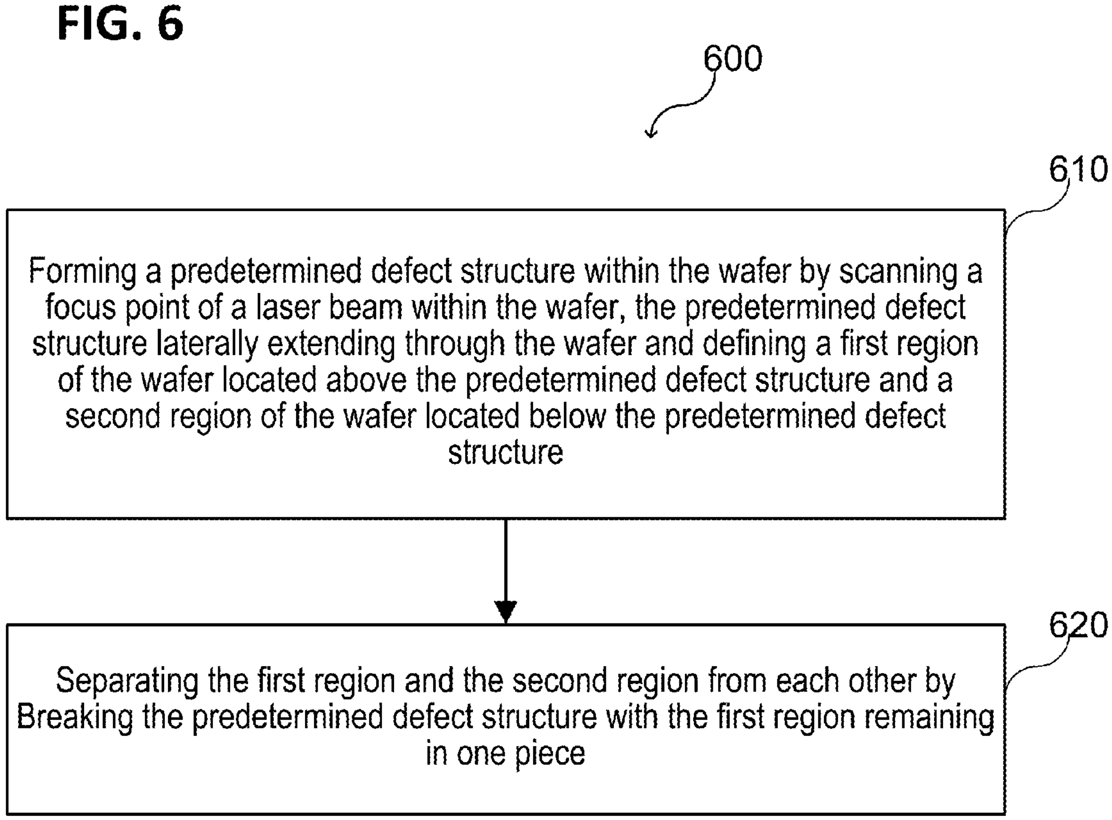
FIG. 6 shows a schematic flow diagram of a method for processing a wafer, according to various embodiments.

FIG. 6 shows a schematic flow diagram of a method 600 for processing a wafer 200 (e.g. a carrier in wafer size and/or wafer shape), according to various embodiments. The method 600 may include: in 610, forming a defect structure 204 within the wafer 200 by scanning a focus region of a laser beam within the wafer 200, the defect structure 204 laterally extending through the wafer 200 and defining a first region 202a of the wafer 200 located above the defect structure 204 and a second region 202b of the wafer 200 located below the defect structure 204, and, subsequently, in 620, separating the first region 202a and the second region 202b from each other by breaking the defect structure 204 with the first region 202a remaining in one piece. Further, also the second region 202b may remain in one piece during separating the first region 202a and the second region 202b from each other.

According to various embodiments, the focus region of the laser beam may be scanned within the carrier 200 along a two-dimensional breaking plane (cf. FIGS. 2A to 4B) or along a three dimensional breaking pattern (cf. FIG. 8). According to various embodiments, a laser may be controlled to scan the focus region of the laser beam within the carrier 200 along a predefined plane or pattern. A feedback loop may be used to control if the respectively generated defect structure 204 is in alignment with the predefined plane or pattern. Possibly occurring deviations may be compensated by adapting the position of the focus region of the laser beam accordingly. According to various embodiments, the defect structure 204 may be formed under more than 80% of a processing surface 200s of the wafer 200 (cf. FIGS. 3A to 4B). The defect structure 204 may also be formed to laterally extend completely through the wafer (cf. FIGS. 2A to 2C).

According to various embodiments, a focused laser beam may be used for thinning a wafer 200 (or any other suitable carrier) by forming a defect structure 204 (also referred to as perforation structure) within the wafer 200. The defect structure 204 may be used to separate a first region 202a (e.g. a thin surface region) of the wafer 200 from the rest (e.g. from a bulk region) of the wafer 200. The generation of the focused laser beam and the control of a laser to generate and guide the focused laser beam are described in the following in more detail.

In general, wafer thinning may be a highly demanding discipline within a chip fabrication process. In this field of application, increasing demands for silicon wafer with a thickness below for example 20 μm and high performance (e.g. with a Total Thickness Variation, TTV, less than about 1 μm) may bring conventional thinning methods, e.g. grinding, towards their physical limits.

Up to date, mainly mechanical thinning procedures are further developed with high efforts. The gain of some percent increase of performance usually goes ahead with remarkable increase of costs and complexity. Anyhow, high end wafer thinning may rely on mounting carrier systems like a tape, a glass carrier, or a silicon wafer, onto the productive wafer followed by grinding, damage removal, and demounting procedures. Therefore, conventionally used wafer thinning processes may include expensive carrier/bond systems and/or high operation costs (e.g. due to tapes, glasses, wheels, chemistry, etc.). Further, conventionally used wafer thinning processes may have a high risk of wafer scrap due to mechanical machining and/or a high risk of wafer scrap due to thin wafer handling. Further, conventionally used wafer thinning processes may have an increased front- and backside defect density, a poor final thickness, and/or a poor Total Thickness Variation performance. Conventionally used high performance TTV procedures may be even more complex and costly including for example a tape plan, mount glass, tape on glass, planarize tape, grinding silicon, and detape.

According to various embodiments, the method for thinning a wafer described herein may include forming a defect structure in a commercially available thick wafer (e.g. with a thickness of about 700 μm or greater than about 700 μm) to separate the wafer into a thin surface region (e.g. with a thickness of less than about 50 μm, or less than about 20 μm) and a bulk region. The thin surface region may be used for manufacturing one or more electronic devices in semiconductor technology.

Figure 7A:
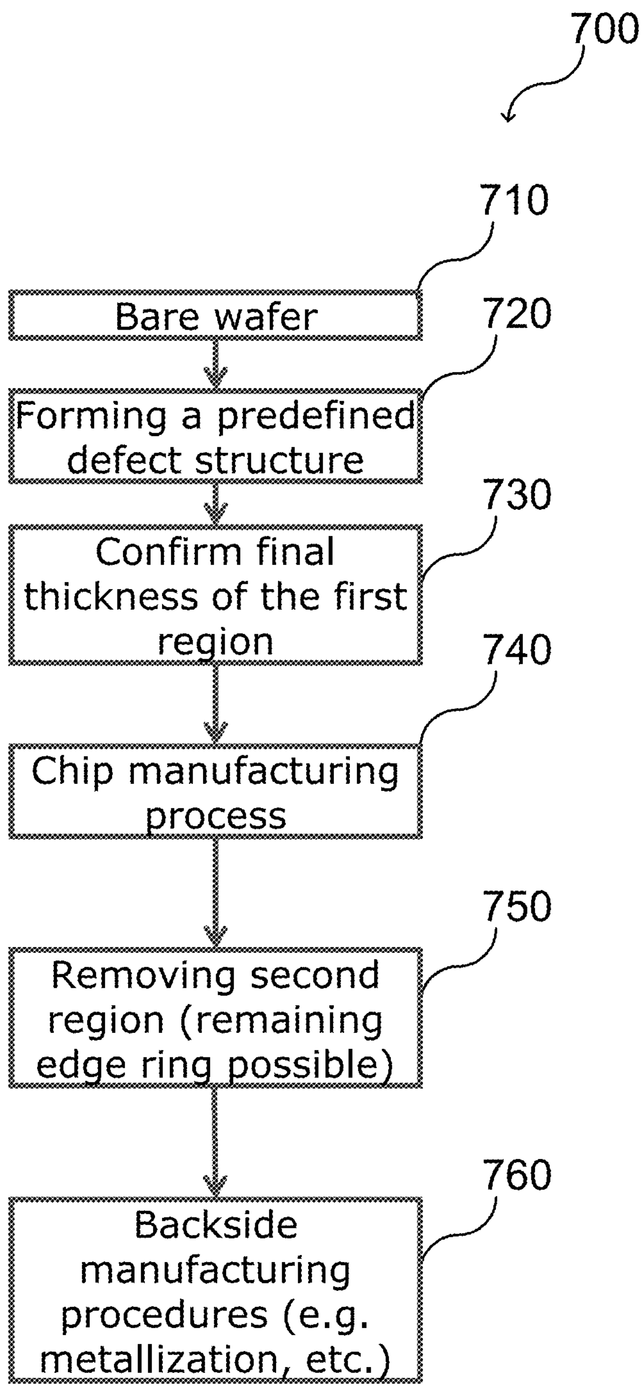
FIG. 7A shows a schematic flow diagram of a method for processing a wafer, according to various embodiments.

FIG. 7A illustrates a process flow in a schematic view referring to processing a wafer 200 or carrier, as described herein. According to various embodiments, a bare wafer 200 may be provided at an initial processing stage 710. Alternatively, the wafer 200 may include one or more electronic circuit structures at this initial processing stage 710. In the case that the wafer 200 includes one or more electronic circuit structures disposed at the first surface 200s of the wafer and the one or more electronic circuit structures might influence the laser beam used for generating the defect structure 204, the laser beam may be provided to enter the wafer 200 from the backside 200r, e.g. through the second surface 200r of the wafer 200.

As illustrated in FIG. 7A, a defect structure 204 may be formed in the wafer 200 in processing stage 720 (also referred to as perforation or perforation process), as described herein, e.g. with reference to FIG. 2A, FIG. 3A, and/or FIG. 8.

Further, the final thickness of the first region 202a may be confirmed in processing stage 730, according to various embodiments. The final thickness of the first region 202a may be understood as the final thickness of the thinned wafer provided by the first region 202a.

Further, one or more chip manufacturing processes may be carried out in processing stage 740, according to various embodiments. For example, one or more integrated circuit structures, sensor structures, light emitting devices, etc., may be formed in the first region 202a. According to various embodiments, any desired structure may be processed in the first region 202a of the wafer 200, e.g. before the first region 202a and the second region 202b are separated from each other. In this processing stage 740, the wafer 200 may be already prepared to be thinned, i.e. the wafer 200 includes the defect structure 204, but the first region 202a and the second region 202b may be still connected to each other. Therefore, the wafer 200 can still be handled easily.

According to various embodiments, the second region 202b may be removed in processing stage 750. In this case, the first region 202a is separated from the second region 202b. Optionally, an edge ring 302 (e.g. an edge region 302) may remain at the first region mechanically supporting the first region 202a, as described before, cf. for example FIG. 4B.

According to various embodiments, one or more backside manufacturing processes may be carried out at the exposed backside surface of the first region 202a in processing stage 750 after the second region 202b has been removed. Backside manufacturing processes may include at least one of polishing, etching, layering (e.g. forming a metallization layer), and the like.

According to various embodiments, a plurality of integrated circuit structures may be formed into the first region

202 before separating the first region 202*a* and the second region 202*b* from each other. For manufacturing the plurality of integrated circuit structures, the wafer 200 may be made of silicon or any other suitable semiconductor material. To avoid recrystallization processes after the defect structure 204 has been formed, the plurality of integrated circuit structures may be formed only via low temperature treatments, e.g. at temperatures less than a recrystallization temperature of silicon (or of the respective semiconductor material of the wafer). In other words, high temperature processes above the respective recrystallization temperature of the wafer material have to be avoided between processing stages 720 and 750, i.e. after forming the defect structure 204 and before separating the first region 202*a* and the second region 202*b* from each other. Since recrystallization effects may anneal defects of the defect structure 204 in such a way that the first region 202*a* and the second region 202*b* of the wafer 200 cannot be separated anymore. Illustratively, the defect structure 204 may be removed via a high temperature anneal due to recrystallization effects. However, this may be used after separating the first region 202*a* and the second region 202*b* of the wafer 200 from each other, cf. FIG. 2C, FIG. 3C, or FIG. 4B.

Figure 7B:
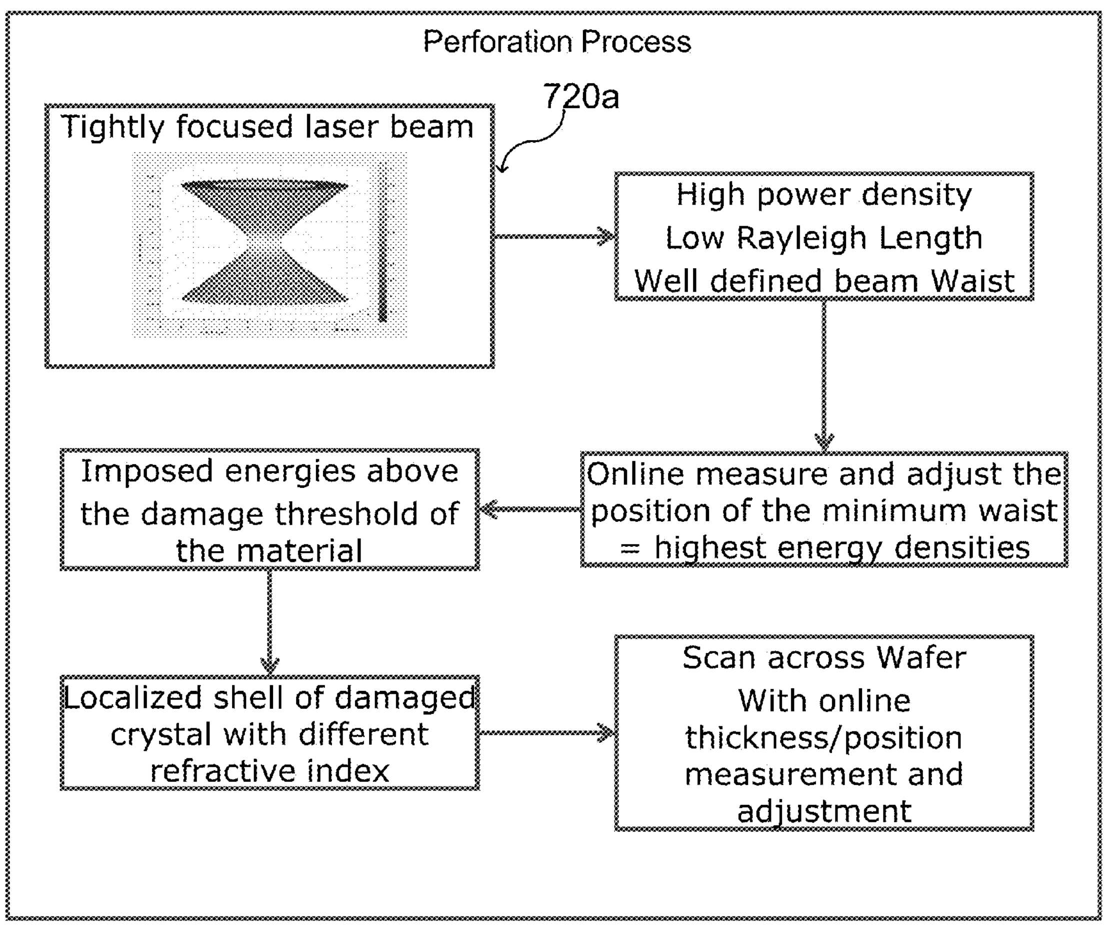
FIGS. 7B to 7G show a wafer processing via a focused laser beam in various schematic views, according to various embodiments.

FIG. 7B illustrates a process flow referring to the perforation process in a schematic view, as described herein (cf. for example processing stage 720 in FIG. 7A). According to various embodiments, a tightly focused laser beam may be generated 720*a*. A focus region of the focused laser beam may be provided with a high energy density and small enough to form the defect structure 204 in the wafer 200 with a desired accuracy. The focused laser beam may be provided via operating a suitably configured laser (e.g. a laser system or laser arrangement). The focused laser beam may be generated with a high power density, a low Rayleigh length (e.g. less than about 1 μm), and a well-defined beam waist (e.g. less than about 1 μm), cf. FIGS. 7C and 7D. The beam waist is measured perpendicular to the optical axis (e.g. perpendicular to the propagation direction of the laser beam). The highest energy densities of the laser beam are present in the position, where the focused laser beam has the minimum waist, i.e. in the focus region.

For generating the defect structure 204 within the wafer 200, the position of the minimum waist (also referred to as focus region) may be measure and adjusted accordingly. According to various embodiments, a laser may be used to generate the focused laser beam. The laser may include optical elements (e.g. at least one lens or at least one mirror) to provide a focus region of the focused laser beam at a desired z-position along a z-direction (and optionally also at a desired position within the x-y-plane). Further, a wafer stage may be used to arrange the wafer 200 relative to the focus region of the focused laser beam and to move the wafer within the x-y-plane (and optionally also in the z-direction) perpendicular to the z-direction. The arrangement of the wafer 200 relative to the position of the focus region of the focused laser beam may be controlled in such a way, that the focused laser beam is provided within the wafer 200 to form the defect structure 204 between the first and second surface 200*s*, 200*r* of the wafer 200.

The focused laser beam is provided in such a way, that energies may be imposed into the wafer 200 above the damage threshold of the respective wafer material (e.g. silicon). This may cause a localized shell of damaged crystal in the wafer 200. The locally damaged wafer material may provide the defect structure. The locally damaged wafer material (e.g. the defect structure 204) may have a different refractive index different from the refractive index of the undamaged wafer material.

The arrangement of the wafer 200 relative to the position of the focus region of the focused laser beam may be controlled in such a way, that the focused laser beam is moved within the wafer 200 to provide the defect structure 204 within the wafer in accordance with to a predefined pattern. Illustratively, the focused laser beam may be scanned across the wafer 200. The focused laser beam is provided with the focus region positioned within the wafer and scanned within the wafer. According to various embodiments, the laser may be scanned in any geometric pattern that causes the desired shape and size of the defect structure 204. As an example, the laser may be scanned to form a defect structure 204 with a planar shape or with a three-dimensional pattern laterally extending within the wafer 200. Also the position of the defect structure 204 relative to the surfaces 202*s*, 202*r* of the wafer 200 may be controlled.

During scanning the focused laser beam across the wafer 200, the thickness and/or the position of the defect structure 204 within the wafer 200 may be measured and the focused laser beam may be adjusted if necessary.

According to various embodiments, a pulsed and tightly focused laser beam may be used to generate the defect structure 204, as described herein. Therefore, a high dose of energy can be imposed (in other words introduced) into a localized region of the wafer 200 resulting in bulk effects (e.g. localized shells of crystal damage). However, surface effects may be avoided, since they may cause delamination, melting, cracking, evaporation and other undesired effects. In transparent media linear absorption of light is suppressed compared to non-linear effects like photoionization (multi-photon, tunneling ionization) or avalanche ionization. These non-linear effects promote electrons from the valence to the conduction band absorbing photons gaining energy and scattering with the grid causing collisional ionization.

While for long laser pulse durations (tau) thermal diffusion has to be taken into account, short pulses (e.g. less than about 1 ns (ns, nano-second) will lead to a permanent restructuration of the bulk material with low thermal diffusion. According to various embodiments, thermal effects or locally heating of the wafer 200 may not result in the formation of the defect structure 204, as described herein. The key to create a perforation plane or perforation pattern within the bulk material of the wafer 200 is to use short pulses (e.g. less than about 1 ns), high power densities above the damage threshold of the bulk material (e.g. for silicon greater than 1 E10 W/cm$^2$, e.g. in the range from about 1 E10 W/cm$^2$ to about 1 E15 W/cm$^2$, e.g. in the range from about 1 E11 W/cm$^2$ to about 1 E14 W/cm$^2$, e.g. in the range from about 1 E13 W/cm$^2$ to about 5 E13 W/cm$^2$), a short Rayleigh length (e.g. less than about 10 μm, e.g. less than about 5 μm, e.g. less than about 1 μm) and a short minimal waist (e.g. less than about 10 μm, e.g. less than about 5 μm, e.g. less than about 1 μm) for a precise location and generation of the defect structure 204.

Figure 7C:
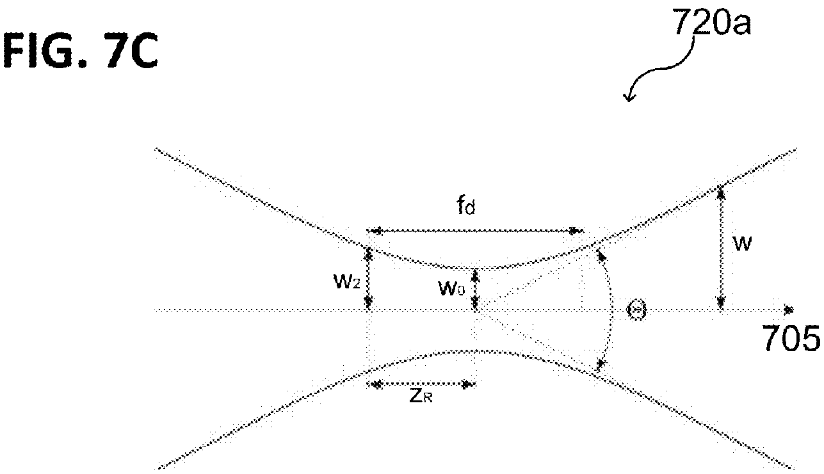

As for example illustrated in FIG. 7C, a beam path for a focused laser beam can be described using the Gaussian Beam Model. The waist (also referred to as Gaussian beam width), w, of a focused laser beam varies along the propagation direction 705 of the focused laser beam (e.g. along the z-axis in a Cartesian coordinate system). A focus region of the focused laser beam may be defined by a minimal waist, $w_0$, and therefore also by a minimal cross-sectional area of the focused laser beam. The Rayleigh length (also referred to as Rayleigh range), $z_R$, may be defined by two positions (see $w_0$, $w_2$ in FIG. 7C) along the z-axis; the first position, $w_0$, is defined by the minimal cross-sectional area of the focused laser beam (measured perpendicular to the z-direction, i.e. at the minimal waist) and at the second position, the cross-sectional area of the laser beam is double the cross-sectional area of the minimum beam waist. The Rayleigh length may also define a depth of focus, $d_f$, (cf. FIG. 7C). Further, the focused laser beam may have a total angular spread, Θ, and a predefined beam quality parameter, M.

The Rayleigh length of a laser beam focused within a wafer 200 may be estimated as follows:

$$z_R = \frac{\pi w_0^2}{\text{lambda}}$$

with $$w_0 \sim M^2 \frac{\text{lambda} f}{\pi n D},$$

wherein lambda is the wavelength of the focused laser beam, f is the focal length of the lens or lens system used for focusing the laser beam, D is the diameter of the laser beam at the lens or lens system, and wherein n is the refraction index of the wafer material (i.e. about 3.6 for silicon).

Since surface effects shall be avoided during generating the defect structure 204, a wavelength may be selected for the focused laser beam in a range where the wafer material is substantially transparent for the laser beam. If the wafer 200 for example includes silicon, the wavelength has to be in the infrared range, e.g. greater than about 800 nm, e.g. in the range from about 800 nm to about 1500 nm, e.g. in the range from about 1000 nm to about 1100 nm.

Figure 7D:
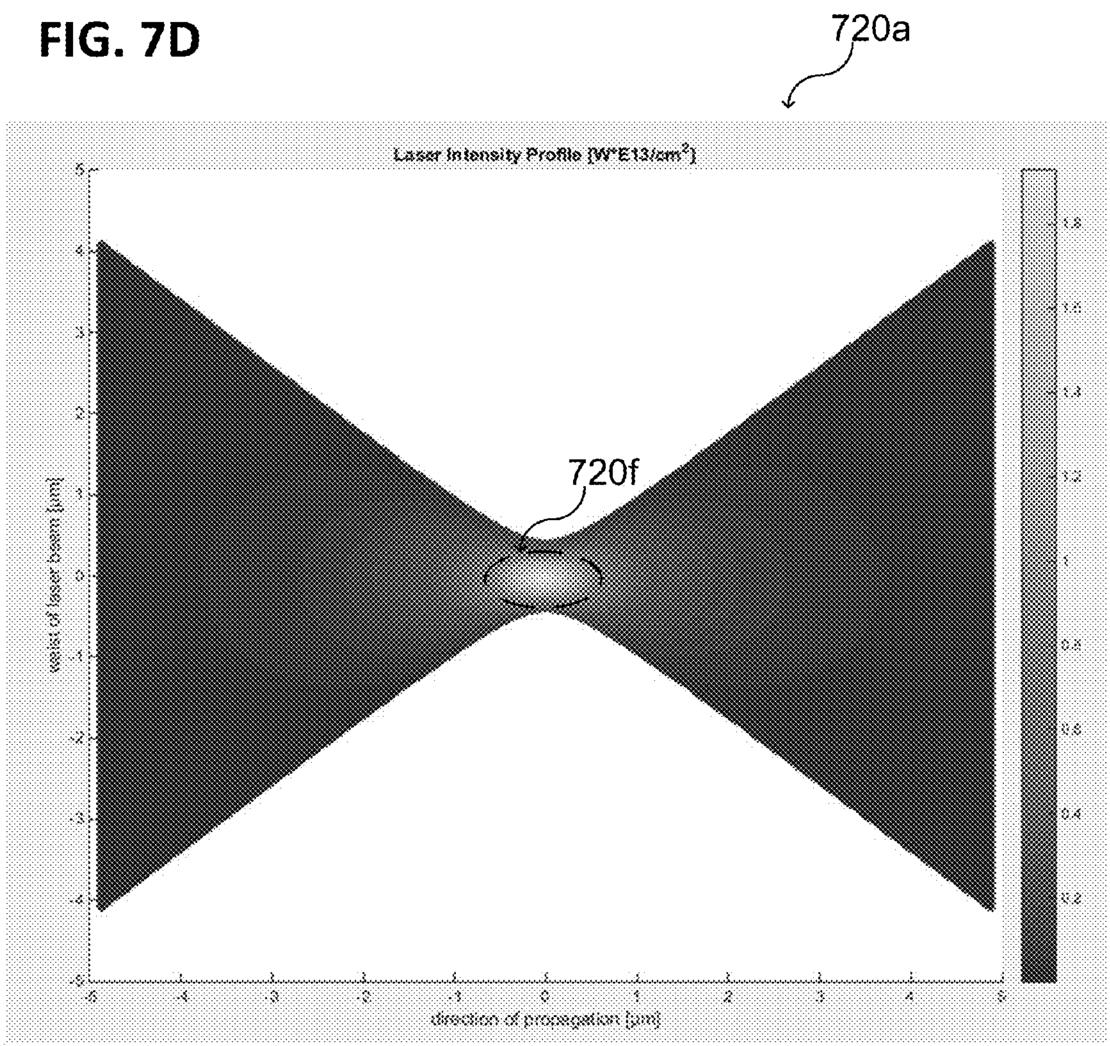

FIG. 7D illustrates a laser intensity profile around the focus region 720*f* of a focused laser beam. The laser intensity (also referred to as power density) in the focus region 720*f* may be above the damage threshold for the respective wafer material. The laser intensity outside the focus region 720*f* may be below the damage threshold. Therefore, the wafer material may only be damaged in the focus region 720*f*. According to various embodiments, the focused laser beam may be scanned across the wafer 200 so that the focus region 720*f* generates the defect structure 204 in the wafer 200, as described herein.

According to various embodiments, the extensions of the focus region 720*f* may be below one micrometer. Further, the extensions of the focus region 720*f* may be still above the diffraction limit. The desired extensions of the focus region 720*f* may be related to a small Rayleigh length and a small minimal waist.

Since surface effects shall be avoided during generating the defect structure 204, the laser may be operated in pulsed mode generating a pulsed focused laser beam.

According to various embodiments, the focused laser beam may be pulsed with a pulse frequency greater than about 1 kHz, e.g. in the range from about 1 kHz to about 20 kHz. Further, the focused laser beam may be pulsed with a pulse duration of less than about 1 ns, e.g. less than about 100 ps, e.g. in the range from about 1 ps to about 1 ns.

As an example, a laser may provide a continuous beam power of about 10 W and may be operated in a pulsed mode. The generated pulsed focused laser beam may have a pulse frequency of about 10 kHz and a pulse duration of about 20 ps. The pulsed focused laser beam may be generated with a wavelength of about 1064 nm. Using for example these operation parameters, surface effects can be avoided and bulk defects can be caused to form the defect structure 204.

Figure 7E:
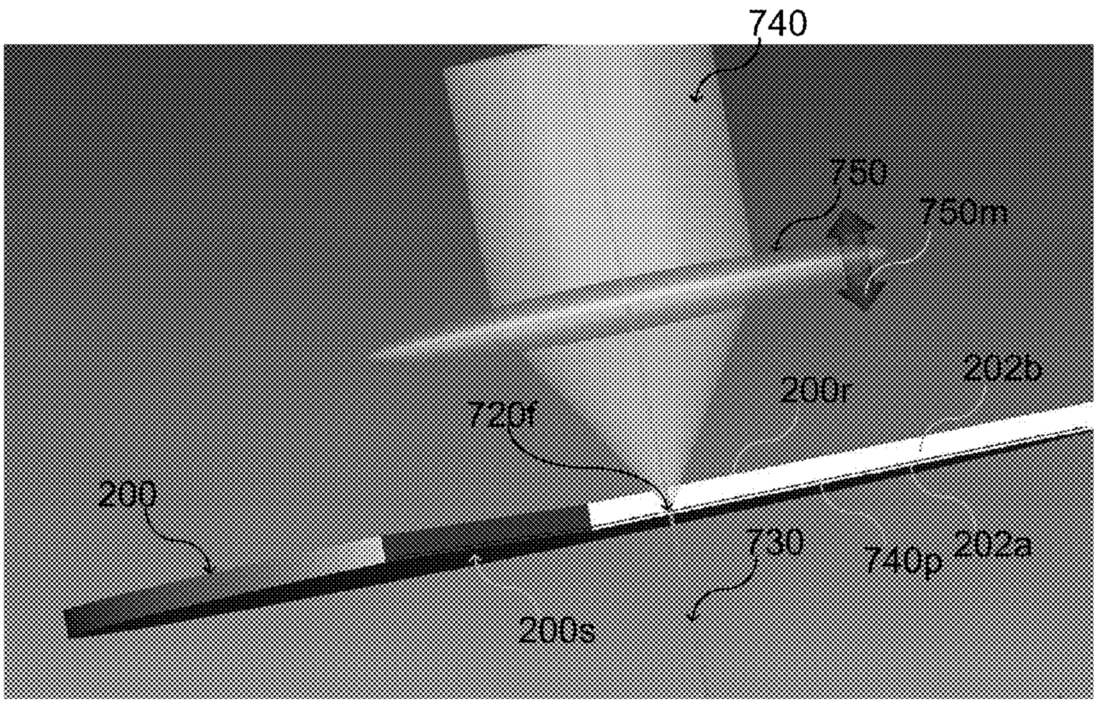
Figure 7F:
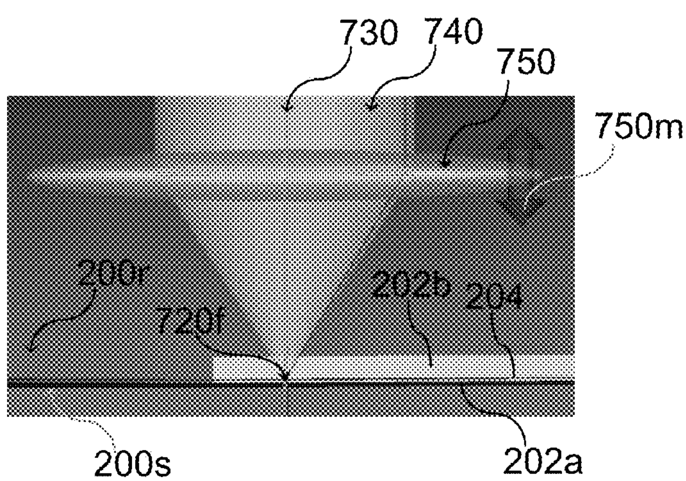

FIG. 7E and FIG. 7F show respectively a schematic view of generating the defect structure 204 within the wafer 200 by a focused laser beam 740. The focused laser beam may be scanned within a plane 740*p* (also referred to as perforation plane or defect plane). An infrared inline thickness measurement 730 may be used to check the position and/or the extension of the defect structure 204 during scanning. Based on this measurement, the final thickness of the first region 202 may be determined (e.g. confirmed). A lens 750 or lens arrangement 750 (e.g. including a plurality of lenses) may be used to focus the laser beam 740. By moving 750*m* the lens 750 or lens arrangement 750 along the z-axis (e.g. perpendicular to the first surface 200*s* of the wafer 200) the z-position of the focus region 720*f* may be changed. Therefore, the position and/or the shape of the defect structure 204 in the wafer 200 may be controlled. For moving the lens 750 or lens arrangement 750 a fast actuator may be used, e.g. a piezo actor.

According to various embodiments, an infrared laser may be used for the infrared inline thickness measurement 730. The infrared inline thickness measurement may be based on a change in the refractive index, n, of the wafer material after being damaged by the focused laser beam 740. The infrared inline thickness measurement 730 and the focused laser beam 740 may be provided in a confocal setup.

According to various embodiments, forming the defect structure 204 by scanning a focused laser beam over a wafer 200 may include at least one of the following process requirements: a high power laser configured to generate short laser pulses, an in-situ measurement system (e.g. an IR-Interferometer, e.g. in confocal setup), a feedback loop for laser spot (focus region) alignment, a fast actuator for laser spot alignment (e.g. a high speed ultrasonic piezo actuator).

The defect structure 204 dimensions may be defined by the laser geometry. The inline (IR-) measurement of the wafer placement and of the position and/or extension of the defect structure 204 may be carried out in confocal setup. However, the focused laser beam may run ahead of the measurement spot of the (IR-) measurement laser.

According to various embodiments, the measurement results provided (IR-) measurement may provide the actuating 750*m* variable for the laser spot positioning lens 750. The wafer 200 may be moved below the Laser and the (IR-) measurement setup.

Figure 7G:
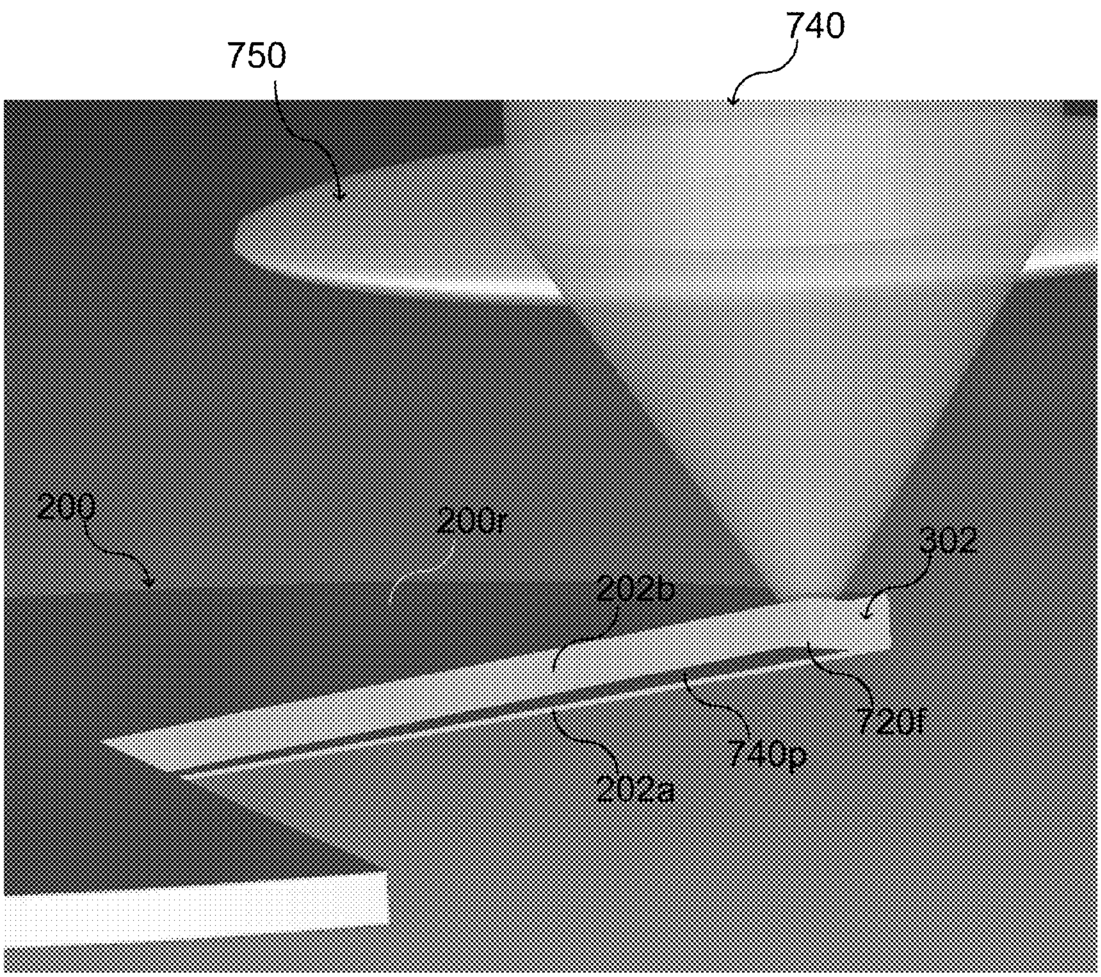

FIG. 7G shows a schematic view of generating the separation structure 414 within the wafer 200 by a focused laser beam 740, cf. for example FIGS. 4A and 4B. The focused laser beam may be moved (e.g. circularly) along the edge region 302 laterally surrounding the second region 202*b* and the separation structure 414 may be formed via changing the z-position of the focus region 720*f*. The separation structure 414 may extent from the defect structure 204 to the second surface 200*r* (e.g. the backside) of the wafer 200, as described herein.

According to various embodiments, a backside lid may be opened and the cover (e.g. the separated second region 202*b*) may be lifted for backside processing. The edge region 302 may be used optionally to provide a sustainment ring for the thin first region 202*a* similar to Taiko processing. Therefore, a higher handling stability can be reached, if necessary. Alternatively, the thin first region 202*a* may be processed via a dicing tape adhered to the first region 202*a*.

Figure 8A:
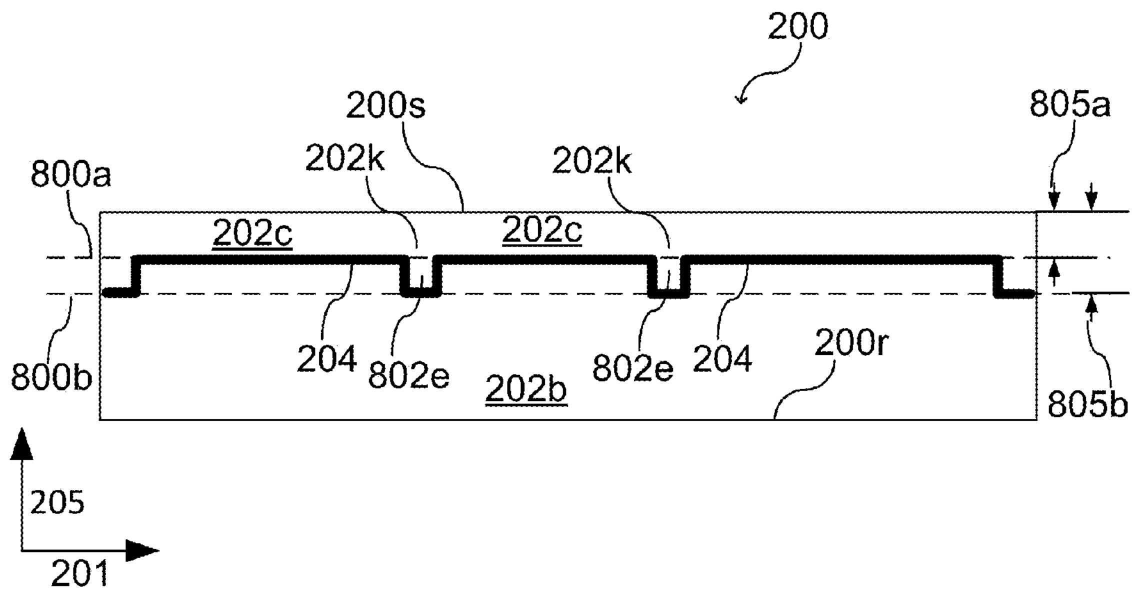
FIGS. 8A and 8B respectively show a wafer and a chip in a schematic view, according to various embodiments.

FIG. 8A illustrates the wafer 200 in a cross sectional view, e.g. after process 110 of method 100 has been carried out, according to various embodiments. The defect structure 204 may have a three-dimensional pattern. However, the defect structure 204 may laterally extend within the wafer 200 as described before exemplarily for a planar (i.e. two-dimensional) defect structure 204.

According to various embodiments, the focused laser beam may be scanned in a first plane 800*a* having a first distance 805*a* from the first surface 200*s* of the wafer 200. The first plane 800*a* may be aligned in parallel to the first surface 200*s* of the wafer 200. Further, the focused laser beam may be scanned in a second plane 800*b* having a second distance 805*b* from the first surface 200*s*. The second plane 800*b* may be aligned in parallel to the first surface 200*s*. The second distance 805*b* may be greater than the first distance 805*a*.

Figure 8B:
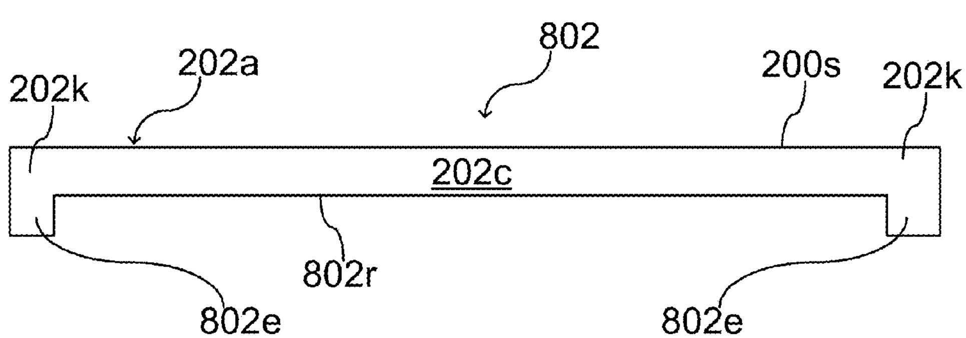

According to various embodiments, the first plane 800*a* may define a plurality of chip regions 202*c* in the first region 202*a*. Further, the second plane 800*b* may define a plurality of kerf regions 202*k* and/or chip edge regions 802*e* in the first region 202. The kerf regions 202*k* laterally surrounding the chip regions 202*c* respectively. After singulating the plurality of chip regions 202*c* into single chips 802 along the kerf regions 202*k*, each chip 802 may include a chip edge region 802*e* laterally surrounding the respective chip 802, as illustrated in FIG. 8B schematically. The chip edge region 802*e* may protrude from the chip backside 802*r* exposed by removing the second region 202*b* from the first region 202*a*.

According to various embodiments, in a similar way any desired defect structure 204 may be formed in the wafer to separate the first region 202*a* and the second region 202*b* from each other.

As described herein, a method 100, 500, 600 may be provided that allows the separation of two wafer regions 202*a*, 202*b* so that one of the wafer regions 202*a*, 202*b* has a desired final thickness to be used as a substrate for semiconductor processing similar to a thin or ultra-thin wafer. The method described herein may allow an accurate control of the final thickness and the Total Thickness Variation (TTV). The final thickness may be validated in advance on the bare Wafer. A ring support system may be easily integrated into the processing. The method may lead to reduced operation costs since no carrier systems (e.g. tapes, glasses, bonds, etc.) may be necessary. Also no recycling procedures of carrier systems may be needed. The method described herein may be used alternatively the conventional grinding processes avoid, for example, wheel consumption. Further, the method described herein may have a low risk of wafer scrap due to thin wafer handling and a low risk of wafer scrap due to standard-procedure-induced defect density. Further, the flow factor may be decreased since many process steps can be saved compared to conventional high quality mechanical wafer thinning. Further, the method described herein may provide a high flexibility. Further, a perforated chip grid may be possible leading to reduced edge chipping. Further, a backside substrate profiling may be possible.

Before manufacturing semiconductor structures a perforation foil may be deposited onto the wafer. By means of a laser beam the surface (opposite to the semiconductor structures) is irradiated exactly into the depth in such a manner that both the silicon beneath the perforation foil and the perforation foil itself is detachable.

Example 1 is a method for processing a wafer, the method including: scanning a focused laser beam over the wafer to form a defect structure within the wafer, the defect structure defining a first region of the wafer located at a first side of the defect structure and a second region of the wafer located at a second side of the defect structure opposite the first side, and an edge region laterally surrounding the defect structure and extending from a first surface of the wafer to a second surface of the wafer opposite the first surface, wherein a surface area of the first region is greater than a surface area of the edge region, and wherein the second region is connected to the first region by the edge region, and, subsequently, separating the first region and the second region from each other along the defect structure, with the first region remaining in one piece.

In Example 2 the method of Example 1 may optionally include that separating the first region and the second region from each other further includes lifting off the second region in one piece from the first region.

In Example 3 the method of Example 1 or 2 may optionally include that the first surface is a main processing surface of the wafer.

In Example 4 the method of any one of Examples 1 to 3 may optionally include that the defect structure is formed under more than 80% of the first surface of the wafer.

In Example 5 the method of any one of Examples 1 to 4 may optionally include that scanning the focused laser beam over the wafer further includes controlling a focus position of the focused laser beam relative to the first surface of the wafer. The focus position may be the position along the propagation direction of focused laser beam where the focused laser beam has the minimal waist. The focus position may define the focus region.

In Example 6 the method of Example 5 may optionally include that scanning the focused laser beam over the wafer further includes controlling an alignment of the wafer relative the focus position.

In Example 7 the method of Example 6 may optionally include that controlling the focus position of the focused laser beam and controlling the alignment of the wafer relative the focus position includes measuring at least one of the following properties: a position of the defect structure; an extension of the defect structure; a placement of the wafer.

In Example 8 the method of Example 7 may optionally include that scanning the focused laser beam over the wafer is controlled via a feedback loop based on at least one of the measured properties. The feedback loop may be configured to check if a pattern of the generated defect structure is in alignment with a predefined pattern.

In Example 9 the method of Example 7 or 8 may optionally include that at least one of the position of the defect structure and the extension of the defect structure is measured via an infrared measuring arrangement.

In Example 10 the method of Example 9 may optionally include that the infrared measuring arrangement and the focused laser beam are provided in a confocal setup.

In Example 11 the method of any one of Examples 1 to 10 may optionally include that the focused laser beam is scanned in a single plane that is aligned in parallel to the first surface of the wafer to form a planar defect structure.

In Example 12 the method of any one of Examples 1 to 11 may optionally include that the focused laser beam is scanned in a first plane having a first distance from the first surface and aligned in parallel to the first surface, and in a second plane having a second distance from the first surface and aligned in parallel to the first surface, wherein the second distance is greater than the first distance.

In Example 13 the method of Example 12 may optionally include that the first plane defines chip regions of the first region and that the second plane defines kerf regions and chip edge regions laterally surrounding the chip regions respectively.

In Example 14 the method of any one of Examples 1 to 13 may optionally include that a thickness of the first region is less than a thickness of the second region.

In Example 15 the method of any one of Examples 1 to 14 may optionally include that a thickness of the first region is less than about 50 μm.

In Example 16 the method of any one of Examples 1 to 15 may optionally include that scanning the focused laser beam over the wafer includes operating a laser in a pulsed mode defining a pulse frequency, a pulse duration, and a power density.

In Example 17 the method of Example 16 may optionally include that the wafer includes a material having a power density damage threshold and that the pulse energy is selected to provide the focused laser beam with a power density greater than the power density damage threshold.

In Example 18 the method of Example 17 may optionally include that the material is silicon. Example 18 may further include that the power density is greater than about $1 \cdot 10^{10}$ W/cm$^2$.

In Example 19 the method of any one of Examples 16 to 18 may optionally include that the pulse duration is less than about 1 ns.

In Example 20 the method of any one of Examples 16 to 19 may optionally include that the pulse frequency is greater than about 1 kHz.

In Example 21 the method of any one of Examples 1 to 20 may optionally include that the focused laser beam has an infrared wavelength.

In Example 22 the method of any one of Examples 1 to 21 may optionally include that the focused laser beam has a Rayleigh length of less than about 10 μm.

In Example 23 the method of any one of Examples 1 to 22 may optionally further include: before separating the first region and the second region from each other, forming a separation structure extending from the second surface of the wafer into the wafer to the defect structure, the separation structure completely laterally surrounding the second region.

In Example 24 the method of any one of Examples 1 to 23 may optionally include that separating the first region and the second region from each other includes: forming a separation structure extending from the second surface of the wafer into the wafer to the defect structure, the separation structure laterally surrounding the second region partially with a connection structure connecting the second region to the edge region, and, subsequently, removing the second region from the first region and the edge region thereby cracking the connection structure.

In Example 25 the method of Example 23 or 24 may optionally include that the separation structure includes at least one of a trench structure and a further defect structure.

In Example 26 the method of any one of Examples 1 to 25 may optionally include that separating the first region and the second region from each other includes subjecting the wafer to a mechanical stress to break the defect structure.

In Example 27 the method of any one of Examples 1 to 26 may optionally include that the wafer includes single crystalline silicon.

In Example 28 the method of Example 27 may optionally include that the defect structure includes disordered silicon. Disordered silicon may include for example polycrystalline silicon and/or amorphous silicon.

In Example 29 the method of any one of Examples 1 to 28 may optionally further include: before separating the first region and the second region from each other and after forming the defect structure within the wafer, forming a plurality of integrated circuit structures in the first region of the wafer.

In Example 30 the method of Example 29 may optionally include that the wafer is not subjected to a high temperature treatment after forming the defect structure within the wafer and before separating the first region and the second region from each other.

In Example 31 the method of any one of Examples 1 to 30 may optionally further include: after separating the first region and the second region from each other, forming a backside metallization on an exposed backside surface of the first region.

Example 32 is a method for processing a carrier, the method including: forming a defect structure within the carrier by scanning a focus region of a laser beam within the carrier, the defect structure defining a first region of the carrier located at a first side of the defect structure and a second region of the carrier located at a second side of the defect structure opposite the first side, and an edge region laterally surrounding the defect structure and extending from a first surface of the carrier to a second surface of the carrier opposite the first surface, wherein the defect structure is formed under more than 80% of the first surface, and wherein the second region is connected to the first region by the edge region, and, subsequently, separating the first region and the second region from each other by breaking the defect structure with at least the first region remaining in one piece.

In Example 33 the method of Example 32 may optionally include that the edge region mechanically supports the first region after the second region is removed from the first region.

In Example 34 the method of Example 32 or 33 may optionally include that the carrier is a wafer.

In Example 35 the method of any one of Examples 32 to 34 may optionally include that the first region includes a plurality of chip regions.

In Example 36 the method of Example 35 may optionally further include: singulating the plurality of chip regions into a plurality of chips after separating the first region and the second region from each other.

Example 37 is a method for processing a wafer, the method including: forming a defect structure within the wafer by scanning a focus region of a laser beam within the wafer, the defect structure laterally extending through the wafer and defining a first region of the wafer located above the defect structure and a second region of the wafer located below the defect structure, and, subsequently, separating the first region and the second region from each other by breaking the defect structure with the first region remaining in one piece.

In Example 38 the method of Example 37 may optionally further include: forming a plurality of integrated circuit structures into the first region before separating the first region and the second region from each other.

In Example 39 the method of Example 38 may optionally include that the wafer is made of silicon and that forming the plurality of integrated circuit structures includes only one or more low temperature treatments at temperatures less than a recrystallization temperature of silicon.

In Example 40 the method of any one of Examples 37 to 39 may optionally include that the defect structure is formed under more than 80% of a processing surface of the wafer.

In Example 41 the method of any one of Examples 37 to 40 may optionally include that the defect structure laterally extends completely through the wafer.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method for processing a wafer, the method comprising:

scanning a focused laser beam over the wafer to form a defect structure within the wafer, the defect structure defining a first region of the wafer located at a first side of the defect structure and a second region of the wafer located at a second side of the defect structure opposite the first side, and an edge region laterally surrounding the defect structure and extending from a first surface of the wafer to a second surface of the wafer opposite the first surface, wherein a surface area of the first region is greater than a surface area of the edge region, and wherein the second region is connected to the first region by the edge region, and, subsequently, separating the first region and the second region from each other along the defect structure, with the first region remaining in one piece, wherein the focused laser beam is scanned in a first plane having a first distance from the first surface and aligned in parallel to the first surface, and in a second plane having a second distance from the first surface and aligned in parallel to the first surface, wherein the second distance is greater than the first distance, and wherein the first plane defines chip regions in the first region and wherein the second plane defines kerf regions and chip edge regions laterally surrounding the chip regions respectively.

2. The method according to claim 1, wherein separating the first region and the second region from each other further comprises to lift off the second region in one piece from the first region.

3. The method according to claim 1, wherein the defect structure is formed under more than 80% of the first surface of the wafer.

4. The method according to claim 1, wherein scanning the focused laser beam over the wafer further comprises controlling a focus position of the focused laser beam and controlling an alignment of the wafer relative the focus position.

5. The method according to claim 4, wherein scanning the focused laser beam over the wafer is controlled via a feedback loop configured to check if a pattern of the formed defect structure is in alignment with a predefined pattern.

6. The method according to claim 4, wherein scanning the focused laser beam over the wafer is controlled via an infrared measuring arrangement.

7. The method according to claim 1, wherein the focused laser beam is scanned in a single plane that is aligned parallel to the first surface of the wafer to form a planar defect structure.

8. The method according to claim 1, wherein a thickness of the first region is less than about 50 μm.

9. The method according to claim 1, wherein scanning the focused laser beam over the wafer comprises operating a laser in a pulsed mode defining a pulse frequency, a pulse duration, and a power density.

10. The method according to claim 9, wherein the wafer comprises a material having a power density damage threshold and wherein the pulse energy is selected to provide the focused laser beam with a power density greater than the power density damage threshold.

11. The method according to claim 10, wherein the material is silicon and wherein the power density is greater than about $1 \cdot 10^{10}$ W/cm$^2$.

12. The method according to claim 9, wherein the pulse duration is less than about 1 ns.

13. The method according to claim 9, wherein the pulse frequency is greater than about 1 kHz.

14. The method according to claim 1, further comprising:

before separating the first region and the second region from each other, forming a separation structure extending from the second surface of the wafer into the wafer to the defect structure, the separation structure laterally surrounding the second region.

15. The method according to claim 14, wherein the separation structure comprises a further defect structure.

16. The method according to claim 1, wherein separating the first region and the second region from each other comprises subjecting the wafer to a mechanical stress to break the defect structure.

17. A method for processing a carrier, the method comprising:

forming a defect structure within the carrier by scanning a focus region of a laser beam within the carrier, the defect structure defining a first region of the carrier located at a first side of the defect structure and a second region of the carrier located at a second side of the defect structure opposite the first side, and an edge region laterally surrounding the defect structure and extending from a first surface of the carrier to a second surface of the carrier opposite the first surface, wherein the defect structure is formed under more than 80% of the first surface, and wherein the second region is connected to the first region by the edge region, and, subsequently, separating the first region and the second region from each other by breaking the defect structure with at least the first region remaining in one piece, wherein the focus region of the laser beam is scanned in a first plane having a first distance from the first surface and aligned in parallel to the first surface, and in a second plane having a second distance from the first surface and aligned in parallel to the first surface, wherein the second distance is greater than the first distance, and wherein the first plane defines chip regions in the first region and wherein the second plane defines kerf regions and chip edge regions laterally surrounding the chip regions respectively.

18. A method for processing a carrier, the method comprising:

forming a defect structure within the carrier by scanning a focus region of a laser beam within the carrier, the defect structure laterally extending through the carrier and defining a first region of the carrier located above the defect structure and a second region of the carrier located below the defect structure, and, subsequently, separating the first region and the second region from each other by breaking the defect structure, wherein the focus region of the laser beam is scanned in a first plane having a first distance from a first surface of the carrier and aligned in parallel to the first surface, and in a second plane having a second distance from the first surface and aligned in parallel to the first surface, wherein the second distance is greater than the first distance, and wherein the first plane defines chip regions in the first region and wherein the second plane defines kerf regions and chip edge regions laterally surrounding the chip regions respectively.

* * * * *